(12) United States Patent
Gupta et al.

(10) Patent No.: US 11,078,774 B2
(45) Date of Patent: Aug. 3, 2021

(54) SYSTEM AND METHOD FOR DETECTING, DIAGNOSING, AND CORRECTING TRIPS OR FAILURES OF ELECTRICAL SUBMERSIBLE PUMPS

(71) Applicants: University of Houston System, Houston, TX (US); Frontender Corporation, Houston, TX (US); Halliburton, Houston, TX (US)

(72) Inventors: Supriya Gupta, Houston, TX (US); Michael Nikolaou, Houston, TX (US); Luigi Saputelli, Houston, TX (US); Cesar Bravo, Richmond, TX (US)

(73) Assignees: University of Houston System, Houston, TX (US); Frontender Corporation, Houston, TX (US); Halliburton, Houston, TX (US)

( * ) Notice: Subject to any disclaimer, the term of this patent is extended or adjusted under 35 U.S.C. 154(b) by 203 days.

(21) Appl. No.: 16/085,318

(22) PCT Filed: Mar. 16, 2017

(86) PCT No.: PCT/US2017/022721
§ 371 (c)(1),
(2) Date: Sep. 14, 2018

(87) PCT Pub. No.: WO2017/161126
PCT Pub. Date: Sep. 21, 2017

(65) Prior Publication Data
US 2020/0325766 A1 Oct. 15, 2020

Related U.S. Application Data

(60) Provisional application No. 62/309,097, filed on Mar. 16, 2016.

(51) Int. Cl.
*E21B 47/008* (2012.01)
*G01R 31/34* (2020.01)

(52) U.S. Cl.
CPC ............ *E21B 47/008* (2020.05); *G01R 31/34* (2013.01)

(58) Field of Classification Search
CPC .............................. E21B 47/008; G01R 31/34
See application file for complete search history.

(56) References Cited

U.S. PATENT DOCUMENTS

| 6,167,965 B1 | 1/2001 | Bearden et al. |
| 2006/0073013 A1 | 4/2006 | Emigholz et al. |

(Continued)

FOREIGN PATENT DOCUMENTS

WO 2015148871 A1 10/2015

OTHER PUBLICATIONS

International Search Report corresponding to PCT/US2017/022721 dated Jul. 27, 2017 (3 pages).

(Continued)

*Primary Examiner* — Brad Harcourt
(74) *Attorney, Agent, or Firm* — Carter, DeLuca & Farrell LLP; George Likourezos

(57) ABSTRACT

The electrical submersible pump (ESP) is currently the fastest growing artificial-lift pumping technology. Deployed across 15 to 20 percent of oil-wells worldwide, ESPs are an efficient and reliable option at high production volumes and greater depths. However, ESP performance is often observed to decline gradually and reach the point of service interruption due to factors like high gas volumes, high temperature, and corrosion. The financial impact of ESP failure is substantial, from both lost production and replacement costs. Therefore, ESP performance in extensively monitored, and numerous workflows exist to suggest actions in case of (Continued)

break-downs. However, such workflows are reactive in nature, i.e., action is taken after tripping or failure. Therefore, a data-driven analytical framework is proposed to advance towards a proactive approach to ESP health monitoring based on predictive analytics to detect impending problems, diagnose their cause, and prescribe preventive action.

24 Claims, 19 Drawing Sheets

(56) References Cited

U.S. PATENT DOCUMENTS

2007/0252717 A1  11/2007  Fielder
2010/0169030 A1   7/2010  Parlos
2017/0363088 A1* 12/2017  Nguyen ................ E21B 43/128

OTHER PUBLICATIONS

International Preliminary Report on Patentability and Written Opinion corresponding to PCT/US2017/022721 dated Sep. 27, 2018 (11 pages).

\* cited by examiner

SYSTEM AND METHOD FOR DETECTING, DIAGNOSING, AND CORRECTING TRIPS OR FAILURES OF ELECTRICAL SUBMERSIBLE PUMPS

CROSS-REFERENCE TO RELATED APPLICATIONS

This application claims the benefit of and priority to U.S. Provisional Patent Application Ser. No. 62/309,097, filed on Mar. 16, 2016, the entire content of which is incorporated by reference herein.

BACKGROUND

Technical Field

The present disclosure relates to electrical submersible pumps. More particularly, the present disclosure relates to a system and method for detecting, diagnosing, and correcting trips or failures of electrical submersible pumps.

Description of Related Art

Artificial lift techniques are employed when reservoirs do not have enough energy to naturally produce oil or gas to the surface or at desired economic rates. More than 90% of producing oil wells require some form of artificial lift. The electrical submersible pump (ESP) is the fastest growing form of artificial-lift pumping technology. About 15 to 20 percent of almost one million wells worldwide are pumped with some form of artificial lift employing ESPs. Among all oil field lift systems ESPs are often considered efficient and reliable for pumping high volumes from deeper wells. They are adaptable to highly deviated wells and deployed in varied operating environments all over the world. These pumps have a very broad application range and enable recovery of hydrocarbon fluids from greater depths at higher temperatures while handling a range of viscosities, gas-liquid ratios, and solids production.

FIG. 1 illustrates a conventional ESP installation system. It primarily consists of an electric submersible motor, a multistage centrifugal pump, tubing string and protector section. The ESP runs in the tubing string. The motor is at the lower part of the installation unit and is a three phase induction motor providing energy to drive the pump. The protector or seal section connects the motor to the pump, prevents well fluids from entering the motor, and equalizes pressures between the motor and the wellbore.

A gas separator is situated above the protector and allows well fluids to enter the centrifugal pump. In addition, it removes free gas from the wellstream. The multistage centrifugal pump, central to the ESP operation, lifts the liquid to the surface. It converts energy of the electric motor into velocity or kinetic energy and then into potential energy of a fluid (head) that is being pumped.

In 2009, Spears & Associates estimated that ESP accounted for 58% of the total artificial lift market of $5.8 billion. In other words, the industry spends more money annually on ESPs than for all other forms of artificial lift combined, as illustrated in FIG. 2. Equipment technology advancements along with the enhanced application experience of both producers and ESP suppliers have improved ESP operating life. Over the years, the most common concern of ESP users has been that ESP workover costs are high while ESP system run life is inadequately low.

It is often observed that ESP performance declines gradually due to a number of factors such as high-gas volumes, produced abrasive solids, high-temperatures, and corrosive environments. It has been estimated that ESP failures in ultra-deep-water offshore fields could lead to $200 million in revenue loss and $20 million in replacement costs. GE Oil and Gas has also conducted a study to estimate the cost of ESP failure in various operating environments. According to GE, the cost of loss production could be up to $3 million while the cost of intervention could be up to $1 million per well annually. Table 1 below highlights the assumptions and results for the GE study.

TABLE 1

| Assumptions and Results from a GE Study of ESP failure costs | |
|---|---|
| Lost production Cost | |
| Price of oil barrel | $100 |
| Typical production | 500 b/d |
| Water cut | 70% |
| Estimated downtime | 2 days |
| Estimated incidents/year | 10 |
| Estimated savings | 500 b/d × 20 × 0.3 × $60 = $1.8MM |
| Intervention Cost | |
| Onshore conventional well | $5K to $25K per intervention |
| Onshore unconventional well | $150K to $250K |
| Offshore well | Up to $1MM |

Given the high cost of an ESP failure, operators are increasingly using downhole and surface sensors to monitor ESP performance. A few key variables are continuously monitored and analyzed to assess the health of ESP equipment. Safe operating thresholds for these key variables are set in an ESP so that it can proactively stop if any of these variables take values beyond the safe operation limits of the ESP and a failure is imminent. This is known as a "trip." It is one step before a "failure." Ammeter charts have typically been offered over many decades as the simplest diagnostic solution to troubleshoot ESP installations by recording the behavior of electric current drawn by the ESP motor. These have proved to be useful in detecting and correcting minor operational issues. ESP system monitoring has evolved over the years and more and more wells are equipped with sophisticated permanent downhole sensors providing a wealth of information through continuous monitoring of a lot of downhole variables. Exploration and Production (E&P) companies are deploying web-based platforms for real-time surveillance of their producing assets and numerous workflows exist that provide suggestions for actions in case of an ESP failure. However, such workflows are reactive in nature, i.e., action is taken after a failure has occurred. In addition, typical workflows focus on ensuring that single variables related to ESP operation stay within limits, a practice that may easily miss situations where interacting variables may individually stay within limits but collectively are outside normal operating conditions, thus potentially causing failure threats (FIG. 4B). Consequently, there is a need and an opportunity to advance from a reactive approach towards failure situations to a more proactive approach based on predictive analysis and preventive action based on combining reservoir and production engineering principles with sophisticated mathematical models for prediction of impending abnormal situations in ESPs, such as trip and failure events. A proactive approach can be based on monitoring vital statistics related to ESP operation and performance, thus helping detect, diagnose, and possibly correct impending failures. Such an approach can optimize production, reduce intervention costs, and extend the life expectancy of the ESP, thus eventually offering substantial economic benefits. Therefore, what is needed is a method and system for detecting, diagnosing, and correcting impending abnormal situations in ESPs.

SUMMARY

Embodiments of the present disclosure are described in detail with reference to the drawing figures wherein like reference numerals identify similar or identical elements.

An aspect of the present disclosure provides a method for predicting and preventing electrical submersible pump (ESP) trip and failure events. The method includes the steps of collecting data, in real time, from a well and an ESP positioned in a well via a plurality of sensors, manipulating historical data to determine and evaluate a plurality of decision variables, using mathematical models to derive trends and patterns based on a relationship between the plurality of decision variables and behavior of the ESP, associating the trends and patterns with trip and failure events, diagnosing causes of the trip and failure events, and prescribing remedial action to prevent the trip and failure events.

An aspect of the present disclosure provides a method for monitoring performance of an electrical submersible pump (ESP) in a well. The method includes the steps of selecting a plurality of decision variables, obtaining real-time data related to the plurality of decision variables, detecting patterns from the plurality of decision variables indicating impending events, ranking the plurality of decision variables based on contribution of each variable to the impending events, determining which of the plurality of decision variables are outside a stable operating range, and suggesting remedial action to prevent impending events. The method also includes the steps of selecting a plurality of decision variables, collecting data related to the plurality of decision variables, establishing patterns from the plurality of decision variables indicating absence of impending events (normal operation), determining a stable operating range for each of the plurality of decision variables.

In one aspect, the impending events are a trip or a failure.

In another aspect, the collected data includes (i) time-series of information of the plurality of decision variables across surface, wellbore, and downhole gauges and (ii) times at which a trip or a failure occurred.

In another aspect, the real-time data includes information of the plurality of decision variables across surface, wellbore, and downhole gauges, and on whether a trip or failure occurred.

In yet another aspect, the plurality of decision variables include at least one or more of the following: flowline pressure, wellhead pressure, wellhead temperature, motor current, pump intake pressure, pump discharge pressure, intake temperature, leakage current, motor temperature, system vibration, water cut, free gas intake, total liquid flow rate, system efficiency, pump liquid density, pump head, total pump head, ΔP across pump, ΔP across choke, and ΔP ESP across wellhead.

In one aspect, the method further comprises using a Robust Principal Component Analysis (PCA) methodology to model the plurality of decision variables to establish patterns in collected data and to identify such patterns in the real-time data.

In another aspect, the method further comprises removing outlier data from the collected data or from the real-time data.

In yet another aspect, the method further comprises identifying a training dataset from a stable time period free from impending events where the plurality of decision variables operate in a stable region, and using this dataset to build the Robust PCA model.

In yet another aspect, the method further comprises testing the Robust PCA model built, by comparing the model's predictions of impending events to actual events in the testing dataset, in which deviations from stable behavior of some of the plurality of decision variables actually occurred.

In yet another aspect, the method further comprises determining a contribution of each of the plurality of decision variables to an event and assigning a priority to each of the plurality of decision variables based on their respective contribution.

In yet another aspect, the method further comprises ranking the plurality of decision variables based on computed average contribution.

In yet another aspect, the method further comprises predicting the impending events before occurrence and preventing the impending events by using a data-driven analytical framework.

An aspect of the present disclosure provides a system for monitoring performance of an electrical submersible pump (ESP) in a well. The system includes at least one processor used to control a software algorithm to: select a plurality of decision variables, obtain real-time data related to the plurality of decision variables, detect patterns from the plurality of decision variables indicating impending events, rank the plurality of decision variables based on contribution of each variable to the impending events, determine which of the plurality of decision variables are outside a stable operating range and suggest remedial action to prevent impending events.

An aspect of the present disclosure provides a system for predicting and preventing electrical submersible pump (ESP) trip and failure events. The system includes at least one processor used to control a software algorithm to: collect data, in real-time, from a well and an ESP positioned in a well via a plurality of sensors, manipulate historical data to determine and evaluate a plurality of decision variables, determining a stable operating range for each of the plurality of decision variables, use mathematical models to derive trends and patterns based on a relationship between the plurality of decision variables and behavior of the ESP, associate the trends and patterns with trip and failure events, diagnose causes of the trip and failure events, and prescribe remedial action to prevent or correct the trip and failure events.

Certain embodiments of the present disclosure may include some, all, or none of the above advantages and/or one or more other advantages readily apparent to those skilled in the art from the drawings, descriptions, and claims included herein. Moreover, while specific advantages have been enumerated above, the various embodiments of the present disclosure may include all, some, or none of the enumerated advantages and/or other advantages not specifically enumerated above.

BRIEF DESCRIPTION OF THE DRAWING

Various embodiments of the present disclosure are described herein below with references to the drawings, wherein.

Figure 1:
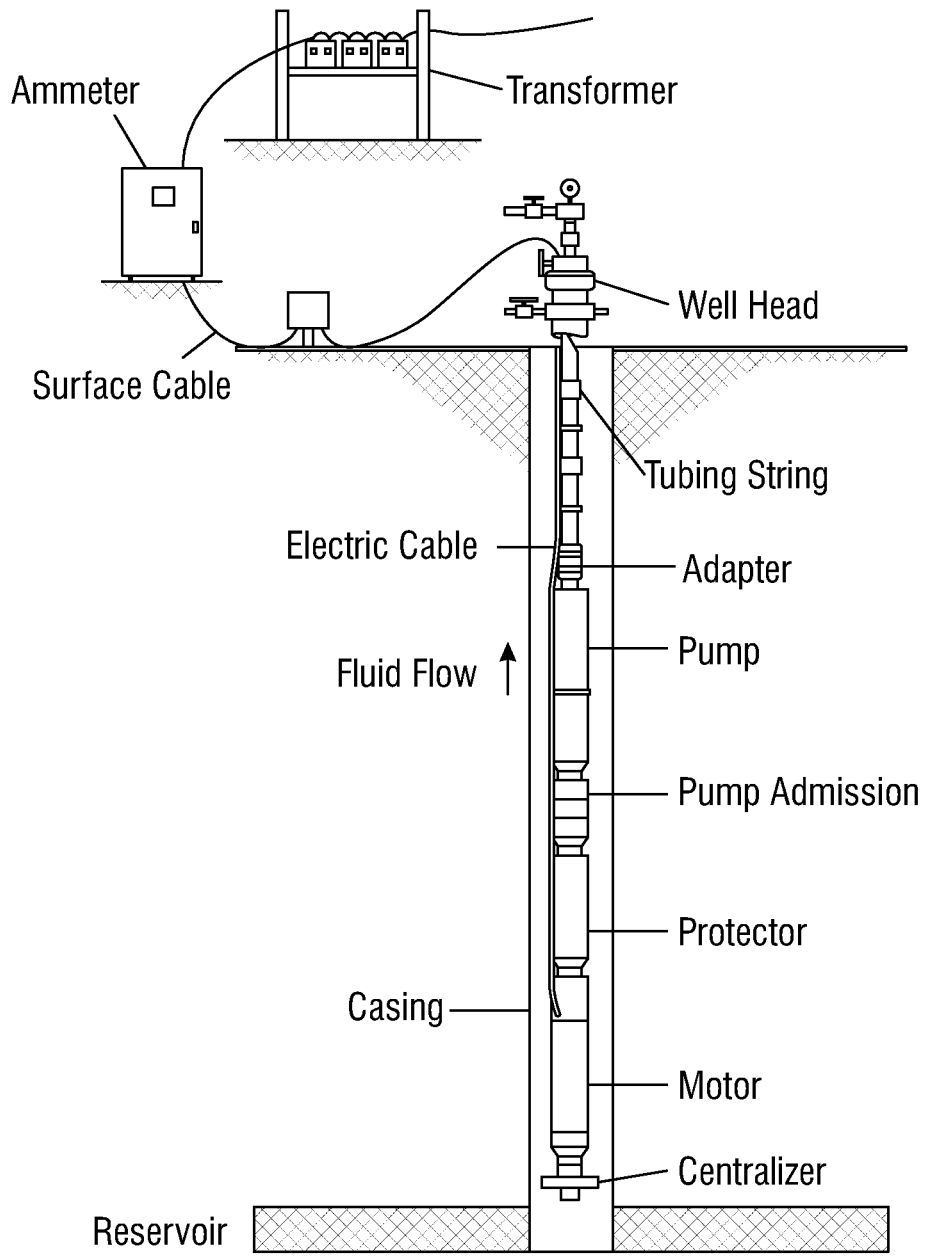
FIG. 1 is an electrical submersible pump (ESP) system.
Figure 2:
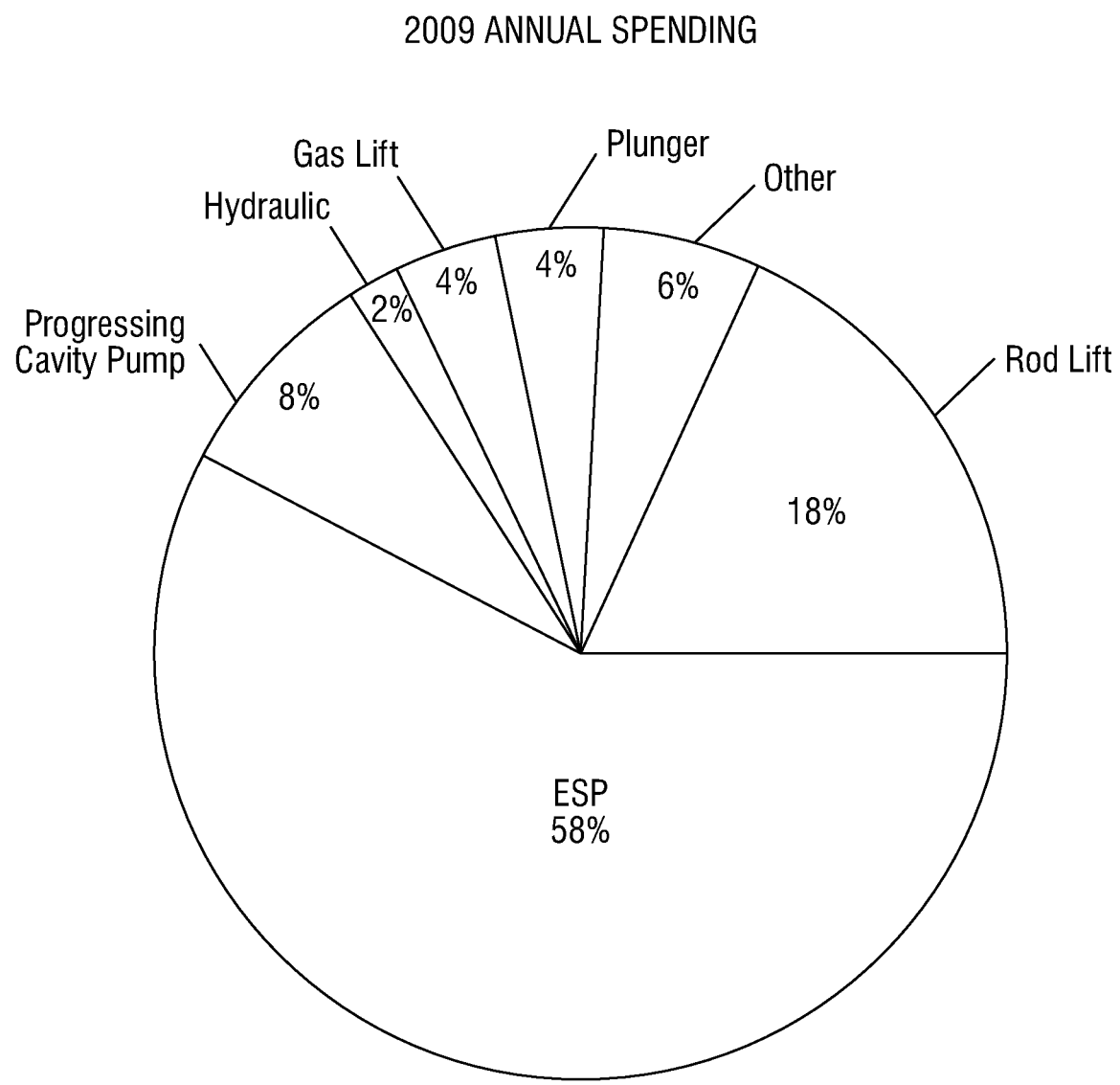
FIG. 2 is a pie-chart illustrating industry spending on artificial lift technology.

The figures depict embodiments of the present disclosure for purposes of illustration only. One skilled in the art will readily recognize from the following disclosure that alternative embodiments of the structures and methods illustrated herein may be employed without departing from the principles of the present disclosure described herein.

DETAILED DESCRIPTION

Although the present disclosure will be described in terms of specific embodiments, it will be readily apparent to those skilled in this art that various modifications, rearrangements and substitutions may be made without departing from the spirit of the present disclosure. The scope of the present disclosure is defined by the claims appended hereto.

For the purposes of promoting an understanding of the principles of the present disclosure, reference will now be made to the exemplary embodiments illustrated in the drawings, and specific language will be used to describe the same. It will nevertheless be understood that no limitation of the scope of the present disclosure is thereby intended. Any alterations and further modifications of the inventive features illustrated herein, and any additional applications of the principles of the present disclosure as illustrated herein, which would occur to one skilled in the relevant art and having possession of this disclosure, are to be considered within the scope of the present disclosure.

The word "exemplary" is used herein to mean "serving as an example, instance, or illustration." Any embodiment described herein as "exemplary" is not necessarily to be construed as preferred or advantageous over other embodiments. The word "example" may be used interchangeably with the term "exemplary."

As real-time technology gains momentum in the oil industry, more and more wells are equipped with permanent downhole sensors which offer a wealth of information. Supervisory control and data acquisition (SCADA) systems and data historians offer a lot of value in terms of reduced operating cost and increased recovery factor. E&P companies are deploying web-based monitoring platforms for real-time surveillance of producing assets. Related workflows assist engineers with their daily surveillance activities for production systems, reservoirs, wells, and fields. This technological framework is redefining production optimization and reservoir management by providing numerous capabilities, such as real-time collaboration of asset teams spread across geographies and enabling faster decision making.

There is a growing trend towards ESPs being fitted with gauges and sensors over the last decade. These downhole monitoring tools protect the ESP by providing valuable operational and production data such as pump intake pressure, pump discharge pressure, bottomhole pressure, motor temperature, current leakage and vibration. A few essential variables are continuously monitored and analyzed to assess the health of the ESP equipment and anticipate impending failure and trip events. This is done to ensure profitable and safe operations. Furthermore, such data enables production engineers to perform pressure transient analysis to analyze reservoir performance by monitoring the key variables during pump shutdowns and startups.

Figure 3:
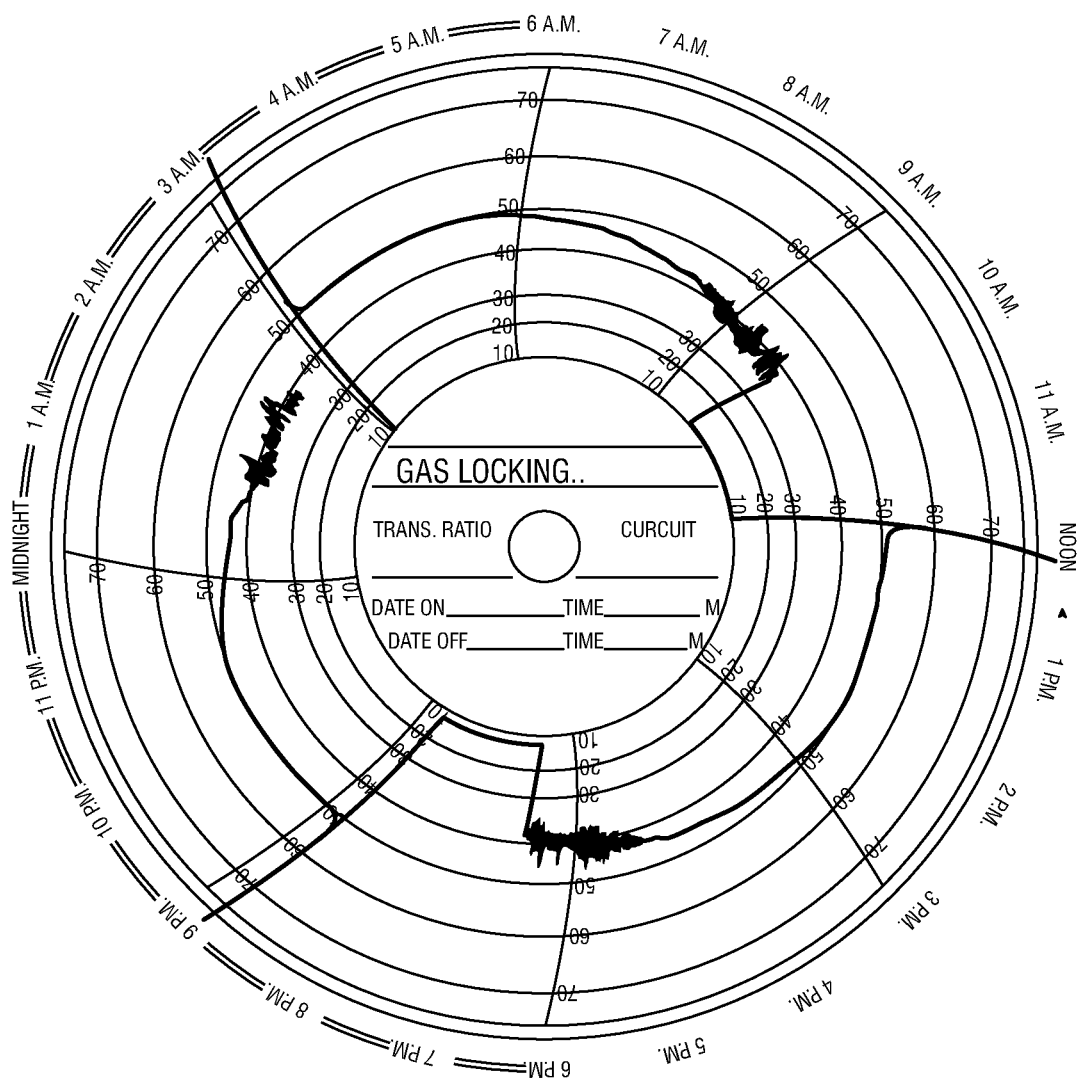
FIG. 3 is an example of an ammeter chart for gas locking.

ESP system monitoring has evolved over the years and ammeter charts came to be offered as the earliest and simplest diagnostic solution to minimize downtimes for many decades. They measure and record the electric current drawn by the ESP motor. The current is recorded continuously as a function of time on a continuous chart with the proper scale. FIG. 3 is a typical example of an Ammeter chart in the scenario of gas locking. Such behavior is observed when the capacity of the ESP unit is greater than the inflow to the well and the well produces substantial free gas volumes.

The proper interpretation of ammeter charts can provide useful information to detect and correct minor operational issues. It provides a very one-sided picture of an ESP unit's operations since it relies on only electrical measurements. Electrical failures are often caused by mechanical or other problems which, over time, develop into a failure of electrical nature. The timely detection of the initial or root failure, therefore, is not an easy task and requires additional information.

The ESP installation works as a system consisting of (1) mechanical, (2) hydraulic, and (3) electrical components and, in order to diagnose and prevent trips or failure, a dynamic system which captures multiple variables affecting an ESP operation in real-time and provides an end-to-end solution is necessary.

Nowadays, ESP controllers use microprocessors to provide greatly improved control and protection of the ESP system's electric components. They measure several other electrical variables than just the current drawn by the motor which can then be stored for immediate or future analysis. Many onshore installations use only an ammeter because of the moderate workover costs, whereas offshore wells rely on sophisticated downhole measurements (DHMs) to a great extent. DHMs provide continuous measurement of crucial downhole variables, such as, pump intake pressure and pump discharge pressure for troubleshooting the system.

Relevant production data has been growing from kilobytes to terabytes in recent years, thus becoming "Big Data." The entire process of gathering, processing, and analyzing such data is often referred to as "analytics." Analytics helps to get maximum value from production data, identifying patterns that allow for real-time event detection, failure prevention, production optimization and forecasting, and helping to reduce the uncertainty in asset management.

Figure 4A:
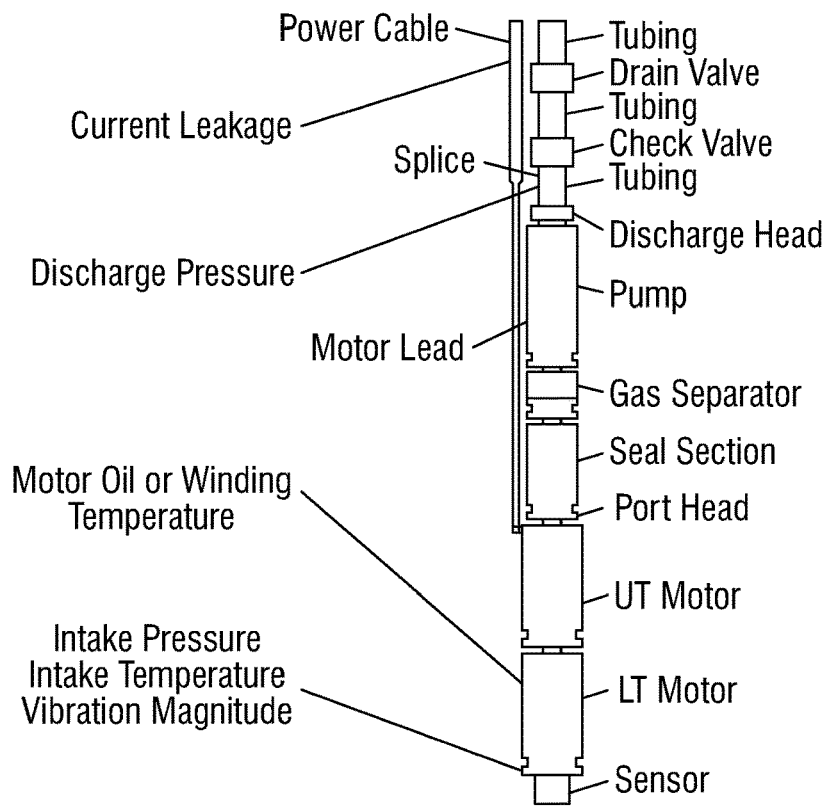
FIG. 4A illustrates variables measured by downhole and surface gauges.
Figure 4B:
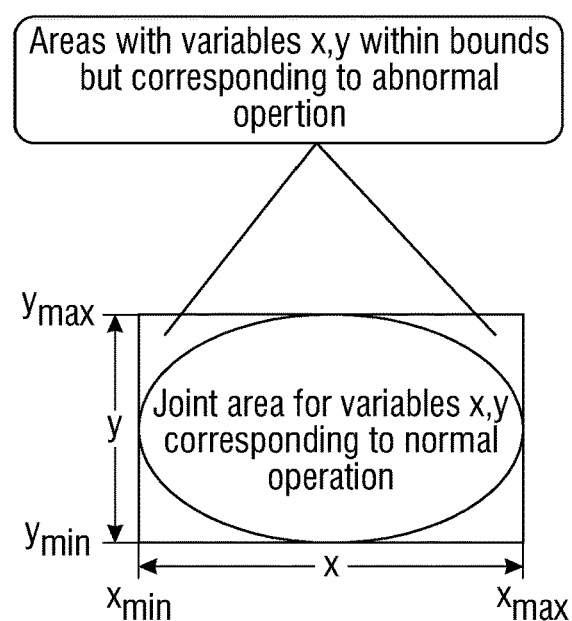
FIG. 4B illustrates variables related to ESP operation where interacting variables may individually stay within limits but collectively are outside normal operating conditions.

In case of ESPs, downhole and surface gauges measure various variables in real-time as shown in FIG. 4. This helps in acquiring essential data and also creates a need to process large amounts of available raw ESP downhole sensor data into useful (actionable) information.

In a quest to reduce costs and optimize maintenance of ESPs, this need for obtaining useful ESP operational information creates opportunities to develop data-driven methods that can detect and potentially diagnose impending problems with ESP.

The exemplary embodiments of the present disclosure advance from a reactive approach, where trips or failures are analyzed after they have already occurred, to a proactive approach which would enable timely prediction of ESP behavior and detection of ESP impending trips or failures through intelligent analysis. Such analysis can improve the way operators address and preferably prevent ESP shutdowns and potentially damaging situations that are commonplace in remote well operations.

Reference will now be made in detail to embodiments of the present disclosure. While certain embodiments of the present disclosure will be described, it will be understood that it is not intended to limit the embodiments of the present disclosure to those described embodiments. To the contrary, reference to embodiments of the present disclosure is intended to cover alternatives, modifications, and equivalents as may be included within the spirit and scope of the embodiments of the present disclosure as defined by the appended claims.

Historically, E&P Oil and gas industry has used vast quantities of data to understand subsurface reservoirs and define optimum hydrocarbon evacuation strategies. Data in the form of seismic surveys, open hole and cased hole logging data, PVT and core sample analysis, reservoir production and pressure information etc. has been traditionally used to describe the reservoir and make technical decisions. In the recent past, improvements in sensors and computation toolkits have shifted the industry's focus towards intelligent oilfield technologies that enable increased real-time surveillance and analytics to improve oilfield performance. For example, real-time down-hole drilling data may be paired with production data from nearby wells to help adapt their drilling strategy, especially in unconventional fields. Such intelligent oilfield capabilities are provided by a set of tools and techniques known within the industry as "analytics."

In addition to using analytics techniques developed for oilfield applications, several analytics commonly used in other industries are also being adapted for application to oilfield workflows, leading to an increasingly expanding toolkit of robust and effective solutions for oilfield automation.

Various researchers have provided definitions of analytics as outlined below:

Bravo et al. (2013) have defined analytics as "a set of techniques and tools intended for data access, integration, analysis, and visualization, which makes it possible to identify valuable patterns to improve the decision-making process in a work environment."

Derrick et al. (2013) define it as "application of ideas from a loose coalition of technical disciplines, including statistics, artificial intelligence, and information technology to the discovery and communication of meaningful patterns in data."

Stone (2007) describes analytics as "investigating pattern-recognition techniques that find correlations and relationships in large data sets."

In addition to understanding the term "analytics," it is important to understand the term "big data." According to Brule (2013), "big data" has three main features: volume, velocity, and variety. Therefore, the term "big data" often refers to large, unstructured datasets with non-standard formats or frequency of data capture. Such datasets often combine what is called "data in motion" (e.g., real-time data), with "data-at-rest," such as configuration and historic data.

Analytics can be used to analyze the past, evaluate current performance, and predict future behavior of a system or process. Bravo et al (2013) have classified analytics into three categories:

Descriptive analytics: This type of analytics relies on analysis and visualization of historic data to obtain insights into a system or process. Typical outcomes from descriptive analytics include dashboards, score cards, business intelligence tools, etc.

Predictive analytics: This type of analytics involves prediction of the future behavior of a process or system based on analysis of historic data.

Prescriptive analytics: This type of analytics is used to define decisions that optimize the performance of a system or process based on the models built using the predictive analytics techniques. Bertolucci (2013) has defined prescriptive analytics as "technology that goes beyond descriptive and predictive analytics; prescriptive tools recommend specific courses of action and show the likely outcome of each decision."

The overall objective of this research study is real-time detection and diagnosis of impending ESP trips or failures. The following methodology has been adopted to achieve this objective:

Use of historical data to determine and evaluate key operational variables (decision variables) that affect ESP performance.

Use of a hybrid approach (combination of first principles and empirical statistics) to develop mathematical models that capture how key variables affect trends and patterns in the behavior of ESPs. Such trends or patterns can then be associated with satisfactory operation, impending problems, or existing problems.

Evaluation of effectiveness of the mathematical models in detecting trends and patterns in available ESP operation data.

Examination of the possibility of using the above models to diagnose potential causes of detected problems.

Development of an approach to prescribe remedial actions to address the problems and prevent downtime due to trip or failure.

Figure 5A:
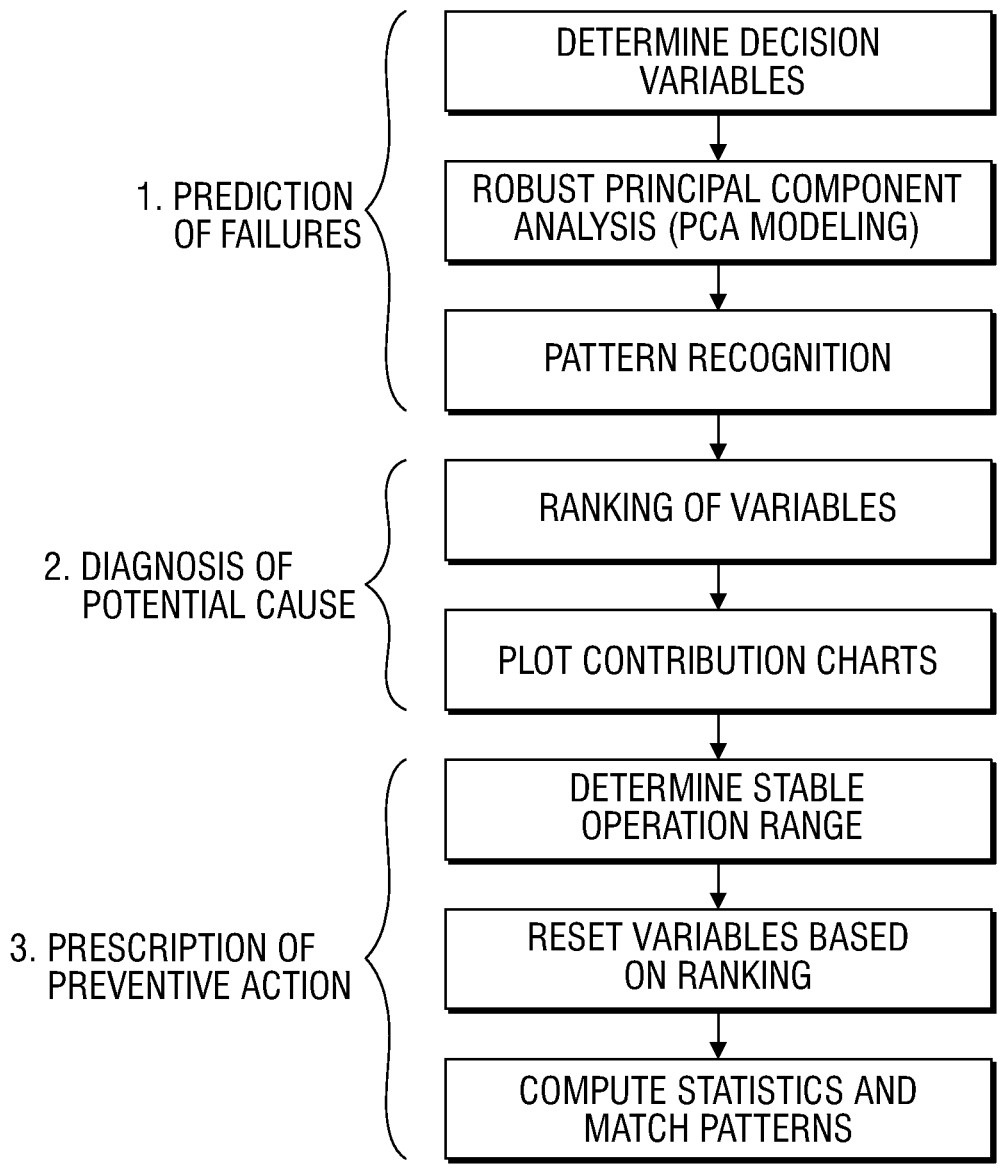
FIG. 5A illustrates an ESP analytics workflow, in accordance with embodiments of the present disclosure.
Figure 5B:
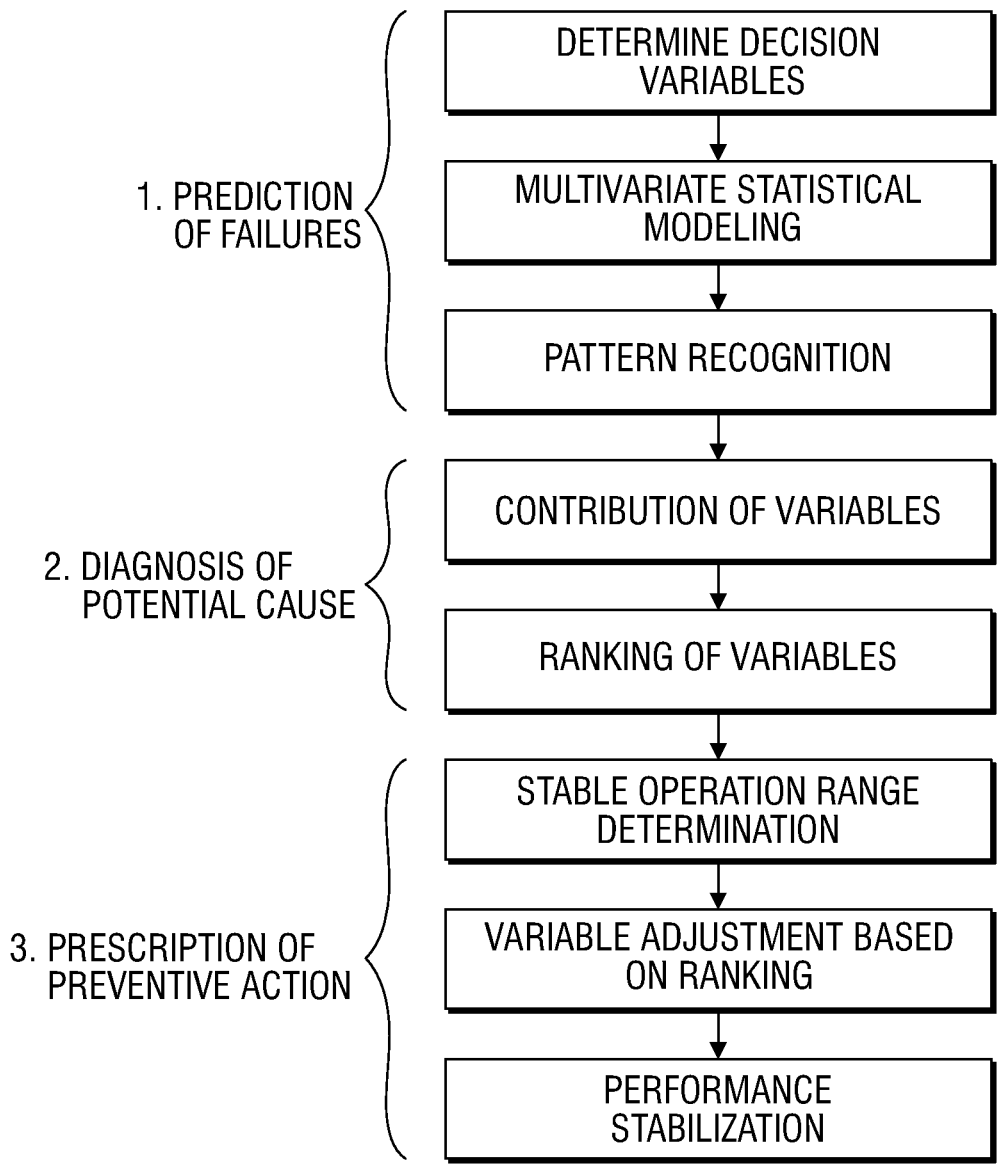
FIG. 5B illustrates another ESP analytics workflow, in accordance with embodiments of the present disclosure.

ESP workflow has been designed which integrates different analytical techniques i.e., predictive analytics, diagnostic analytics and prescriptive analytics in a step by step manner to provide a complete end to end solution for ESP health monitoring and prevention of trips or failures. In the first step of the workflow, decision variables significant to ESP operation are used to detect patterns indicating impending events (trips or failures). In the second step, these variables are ranked based on their contribution to the impending event to detect the cause. In the third step, a stable operating range is determined and a remedial action is suggested to mitigate or prevent the impending event. FIGS. 5A and 5B illustrate the ESP Analytics workflows designed. The various steps of the workflows will be described below.

The first step in the workflow involves prediction of an impending abnormal event such as a Trip or a Failure which can lead to pump downtime. The intent is to use real-time data obtained from surface and downhole sensors to build data analytical models and use the results in a meaningful manner to proactively predict impending events.

It is important to identify and determine key variables significant to ESP performance which can serve as decision variables for input to the analytical model. An oilfield in the Middle East having wells with ESPs was chosen for the study. Two different kinds of data records were obtained:

The first data record contained time series information of different variables across surface, wellbore, and downhole gauges. The data was being recorded in real time at a one-minute interval for one well.

The second record contained information on the time when a trip or failure occurred in that well.

The information from these two records was assimilated to correlate the behavior of the variables long before, immediately before and exactly during the trip or failure event. Five events were analyzed in this study.

Twenty-two real time variables were chosen as decision variables for the model. These variables are defined below:

Flowline Pressure—It is also called the back pressure and is pressure at the discharge of the tubing from the well.

Wellhead Pressure—This is pressure at the wellhead of the producing well.

Wellhead Temperature—This is the temperature at the wellhead of the producing well.

Motor Current A, 5) Motor Current B and 6) Motor Current C—The ESP system contains a three phase induction motor. Downhole sensors measure the current drawn by the three phases of the motor. Any changes in the pump, the well, or the electrical system translate into changes in the current drawn by the ESP motor. Trends in the ESP system's loading can be detected from these current changes. Motor damage caused by electrical or mechanical problems can also be detected from motor current. Changes in produced fluid properties can also be traced by monitoring motor current.

Pump Intake Pressure—This variable indicates the flowing pressure in the well at the level of the ESP pump's suction. The PIP helps to detect whether free gas enters the pump or not. It is also strongly related to the well's FBHP (flowing bottomhole pressure) and its inflow rate; greater PIPs meaning lower liquid rates. Because of all these factors, PIP can provide a reliable way to control the operation of the ESP system. Changes in PIP indicate changes in pump performance, well inflow, or installation integrity.

Pump Discharge Pressure—It is a measure of the discharge pressure of the pump. This reading and the pump intake pressure provide a measurement of the total developed head (TDH) of the pump. Comparison of this value to the design TDH enables monitoring of hydraulic performance of the pump.

Intake Temperature—This measurement provides the temperature of the intake fluid into the pump. It increases as warmer reservoir fluids flow into the wellbore.

Leakage Current—This measurement is the current leakage from the ESP cable due to earth fault.

Motor Temperature—Motor temperature is the measured temperature of the motor windings or that of the motor oil. If used in system control, measured temperature must not be allowed to rise significantly above the motor's rated temperature.

System Vibration—System vibration indicate the onset of problems which may later lead to more severe mechanical or electrical problems.

Water Cut—It is a measure of the ratio of water produced to the amount of total liquids produced in the well.

Free Gas Intake—It is a measure of the gas produced in the wellbore that enters into the pump. Free gas in the ESP pump rapidly ruins the pump's efficiency and increased gas volumes may cause fluctuations of pump output causing surges in well production.

Total Liquid Flow rate—It is a measure of the total liquids being produced in the well. It allows the determination of the pump's operating point on the performance curve. It is the first indicator of downhole problems such as equipment wear, leaks, etc. Changing well inflow can easily be detected from the trend of liquid rate.

System efficiency—This is the ratio of the power exerted by the pump to lift a given amount of liquid against the operating head ($P_{hydr}$) and the mechanical power required to drive the pump (BHP).

$P_{hydr}$ is calculated using the equation:

$$P_{hydr}=7.368*10^{-6}Hq\rho, \quad (1)$$

where H is head generated by the pump in ft, q is the pumping rate in bpd and ρ specific gravity of the fluid.

Pump Fluid Density—This is the density of the fluid entering the centrifugal pump. The centrifugal pump imparts a high rotational velocity on the fluid entering its impeller but the amount of kinetic energy passed on to the fluid greatly depends on the given fluid's density. Liquid, being denser than gas, receives a great amount of kinetic energy that, after conversion in the pump stage, increases the pressure whereas gas cannot produce the same amount of pressure increase. Due to this reason, centrifugal pumps should always be fed by gas-free, single-phase liquid to ensure reliable operation.

Pump Head—The pressure rise associated with the liquid passing through all the stages of the pump made up of rotating impeller and stationary diffuser in series. Pump head is a function of the diving frequency, flow rate, number of pump stages, fluid gravity and pump efficiency.

Total Pump Head—This corresponds to the total dynamic head. It is the total equivalent height to which the fluid is pumped and considering friction losses in the wellbore.

ΔP across Pump—This is the difference of the discharge pressure of the pump and the intake pressure of the pump. It represents the increase in the operating pressure of the ESP.

ΔP across Choke—This is the difference between wellhead pressure and the flowline pressure. It helps to estimate the value of the back pressure.

ΔP ESP to Wellhead—This is the difference of the discharge pressure of the pump and the wellhead pressure.

The data for these variables is obtained at a frequency of one minute for a two year time period for one well. This time period saw several failure and trip events. The reason behind choosing a large number of variables (22), some of which are inter-dependent, was to be able to capture behavior of all kinds of different attributes which could essentially lead to different failures.

After the decision variables were determined, data-driven techniques employing multi-variate statistics were applied to build models to detect and potentially diagnose impending problems with ESP operation.

Since twenty two variables are being analyzed in real time with a frequency of one minute, it is imperative to use a statistical technique which can reduce the dimensionality in space and provide variables which are combinations of more than one of the decision variables. This enables the intuitive monitoring of EPS operation through observance of the behavior of just a few reduced variables and the ability to draw patterns to link to anomalies. In addition, absence of an output dependent variable which is a consequence of the input variables eliminates the possibility of using any regression techniques.

Principal Component Analysis (PCA) is a dimensionality reduction data driven methodology. PCA is chosen for modeling real-time decision variables to identify patterns in the data. It is a statistical technique that uses an orthogonal transformation to convert a set of observations of possibly correlated or dependent variables into a set of linearly uncorrelated variables which are called Principal Components. The covariance among each pair of principal components is zero. In this manner, PCA removes all the dependencies within the variables. The number of principal components is less than or equal to the number of original variables.

Unfortunately, in classical PCA, both the classical variance (which is being maximized) and the classical covariance matrix (which is being decomposed) are very sensitive to anomalous observations. Therefore, as a consequence, the first components are often attracted toward outlying points and may not capture the variation of the regular observations. This can lead to the conclusion that data reduction based on classical PCA becomes unreliable if outliers are present in the data.

In the exemplary embodiments, since real-time downhole data is being obtained, there is a high probability of encountering outliers as at times the sensors do not function properly or are recording erroneous data. So, the Robust PCA technique was adopted for modeling purposes to remove outliers and use the meaningful data readings as an input feed to the model. The model is constructed, for example by using PLS Eigenvector Toolbox integrated within Matlab.

The PCA model used in the exemplary embodiments follows a three step process.

The first step is feeding a training dataset.

Figure 6:
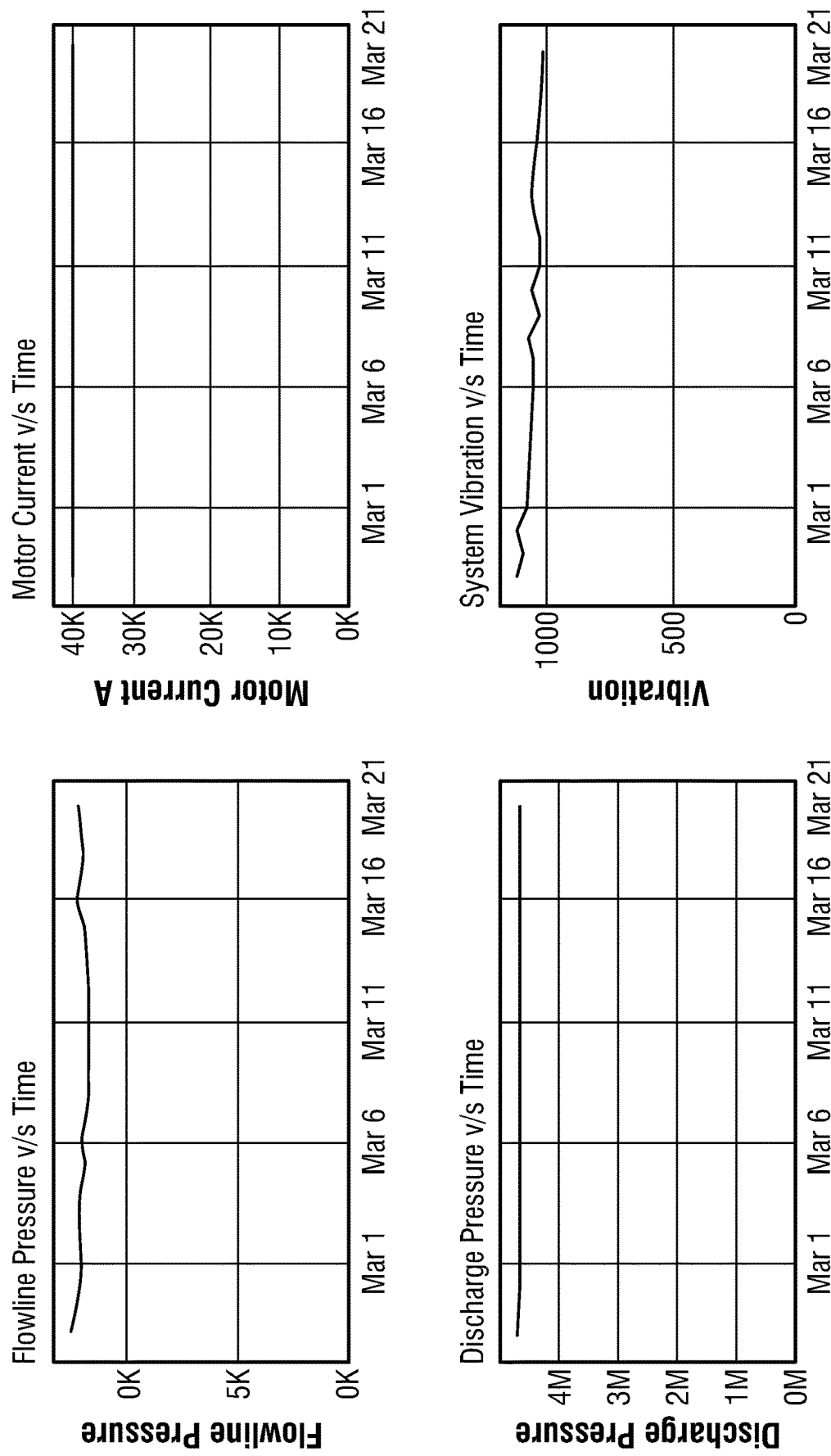
FIG. 6 illustrates a plot of four variables operating at a stable value for an entire time range, in accordance with embodiments of the present disclosure.

From the real-time data, a stable time period is identified when no trip or failure event is observed and all the 22 variables are operating at a stable value. FIG. 6 is an example plot of four such variables operating at a stable value for the entire time range. This data set matrix of t time steps or batches and p variables (22) is chosen as the X matrix and normalized and fed into the PCA model.

The second step is running a robust PCA model.

Using the dataset chosen in the earlier step, the Robust PCA model is run to resist 25% of the outliers. Corresponding T, P and E matrices are obtained as a result of the model. T matrix is the scores matrix [tXR], which is a resultant matrix of the value of Principal components (R) at very time step(t). P matrix is the loadings matrix [pXR] which represents the correlations between variables and the principal components. Optimized number of principal components are selected so that the total number of principal components capture the majority of the variance in the data and any further increase in the number of principal components does not significantly increase the variance captured. The first principal component explains as much variance in the data set as possible and the second principal component explains the next possible variance and the last principal component explains the lowest variance. The T matrix obtained for the stable operating zone was obtained and used for comparison at later stages. The model is created with the loadings matrix P and the residual matrix E and can be used for any future analysis.

The third step is feeding a prediction dataset.

Figure 7:
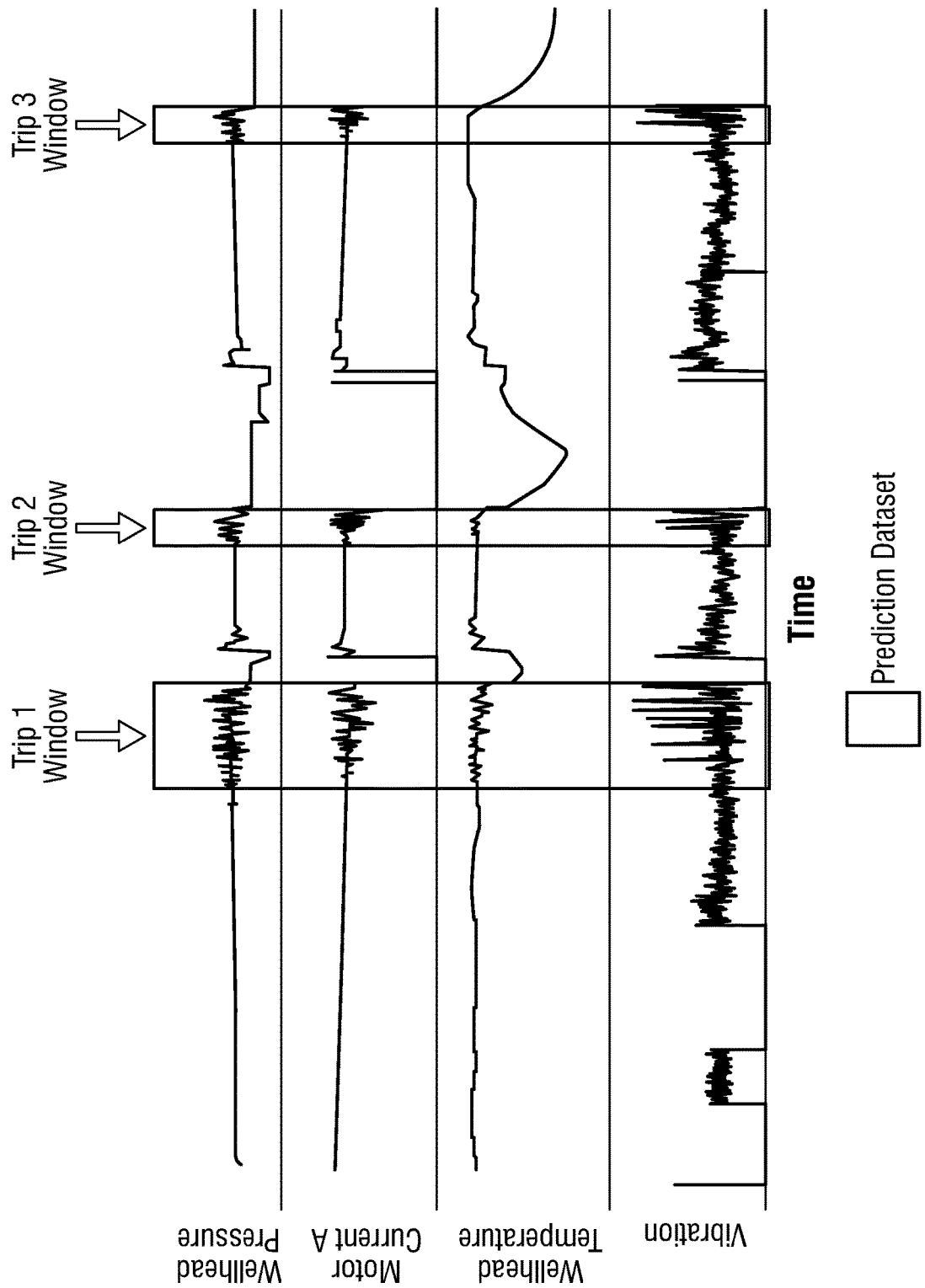
FIG. 7 illustrates the four variables of FIG. 6 deviating from their normal behaviors, in accordance with embodiments of the present disclosure.

From the real-time data sets, windows are identified of time periods when deviations from stable behavior are observed. These transition zones, where the abnormal behavior started until the time when a trip or failure, are observed is captured. Behavior of only four variables during the transition zones for three different trip prediction sets are shown in three boxes in FIG. 7. These matrices are fed as independent Prediction X matrices, each of t time steps by p variables (22) into the model created in the preceding step. For each of the prediction sets, the t time period starts at the point when a deviation from normal trend is seen to the time when the trip or failure eventually occurs. The length of the time period t may vary for each of the trip or failure events depending on how long the deviation from normal behavior is observed. The model with the P and E matrix is rerun for each of these new X matrices. A new T matrix for each prediction data set is obtained and compared against the stable T matrix recorded in the preceding step. This comparison is explained further below.

The Robust PCA model reduces twenty two variables into six principal components. This analytical model comprising of six principal components accounts for 96.92% variation of the given dataset. Table 2 provides information about the cumulative variance captured against the corresponding number of principal components selected for the model.

TABLE 2

PCA Model Results

| Number of Principal Components | Cumulative Variance Captured (%) |
|---|---|
| 1 | 36.82 |
| 2 | 59.91 |
| 3 | 72.81 |
| 4 | 83.05 |
| 5 | 90.90 |
| 6 | 96.92 |

In order to analyze the model results, the scores matrix is determined for the stable operating zone training data set and for each of the five prediction data sets for the trips. The length of the time period t may vary for each of the trip or failure events depending on how long the deviation from normal behavior is observed. As shown in Table 1, the first two principal components capture about 60% of the variance. The scores of only these two principal components are plotted against each other for every batch or time step in the time period t for each of the trips and compared against stable operating zone, as shown in FIG. 8-12.

It is observed that the scores of the two principal components for the stable operation zone form a cluster around the origin (0,0) as shown in FIGS. 8-12. However, as the abnormal behavior becomes more apparent and time steps increase in the transition period further away from the stable zone, the scores plot deviates further away from the cluster centered around the origin. The numbers against the points in each of the figures represent increasing time steps in the transition zone. The last point in the transition zone which is the point at which the trip event occurs lies farthest away from the stable zone and has been marked in each figure.

Figure 8:
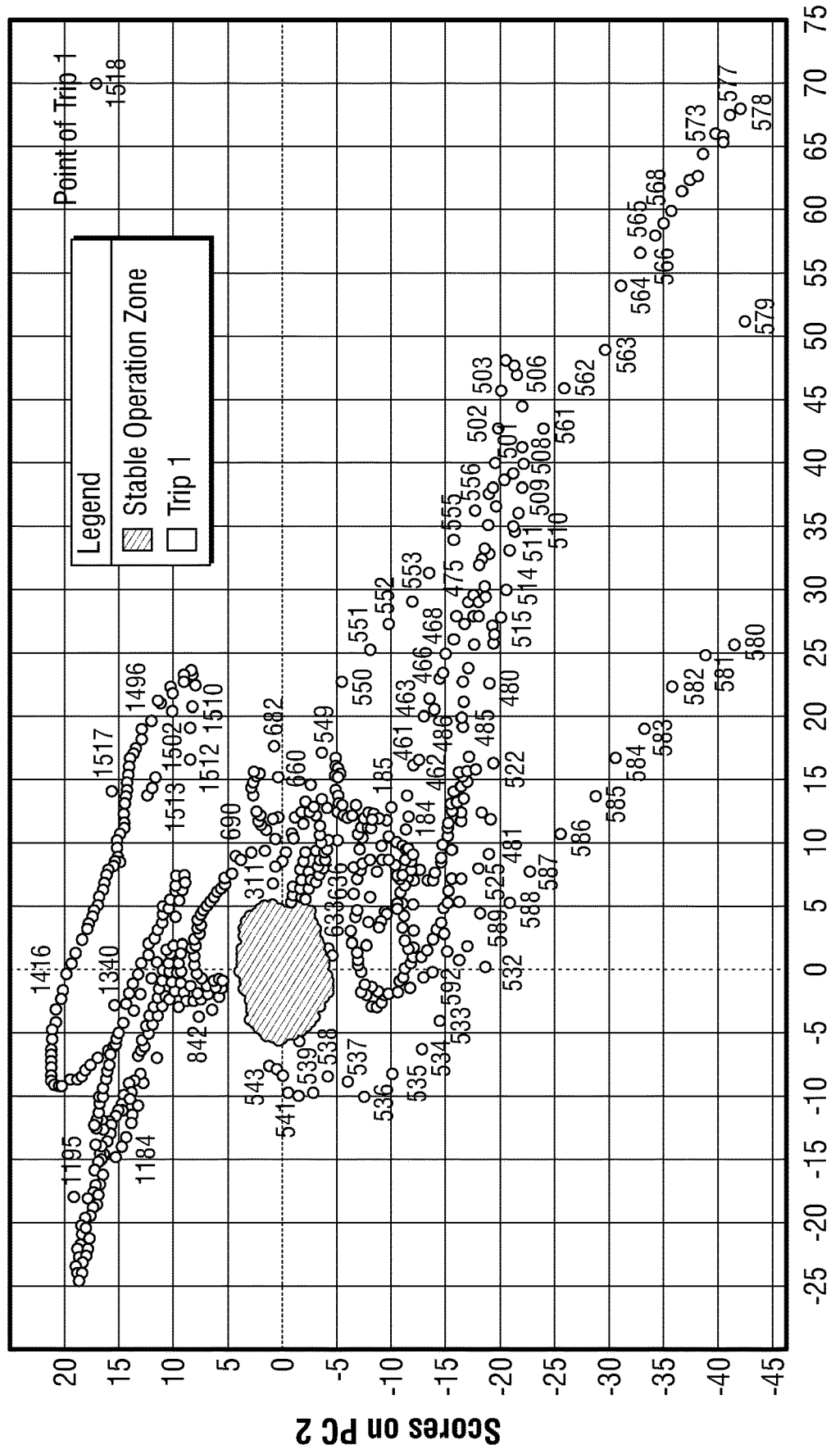
FIG. 8 illustrates comparison of scores of stable operation zones and Trip 1, in accordance with embodiments of the present disclosure.

It is observed that the transition zone spirals around the zone in FIG. 8. This pattern can be explained by the actual scenario leading to the trip. In the first half of the transition zone, there is an increase in motor temperature because of underutilization of the pump leading to abnormal functioning of ESP. During this time period, as time steps increase, the scores deviate further away from the stable values within the zone up till 580th minute. However, to resolve the issue, the production engineer increased the choke flow rate to increase the drawdown. This behavior is captured by the pattern depicted between 581st and 682nd minute where the scores start moving towards the stable range due to the mitigation steps being taken on the field. However, during the drawdown the wellbore pressure while decreasing reached below the bubble point leading to production of gas in the ESP pump. This behavior is shown starting 842nd minute when the scores again start deviating from the zone. The increased production of gas led the ESP to trip at 1518th minute. In this manner, the mathematical results are correlated to the actual physics of the ESP trip event.

Figure 9:
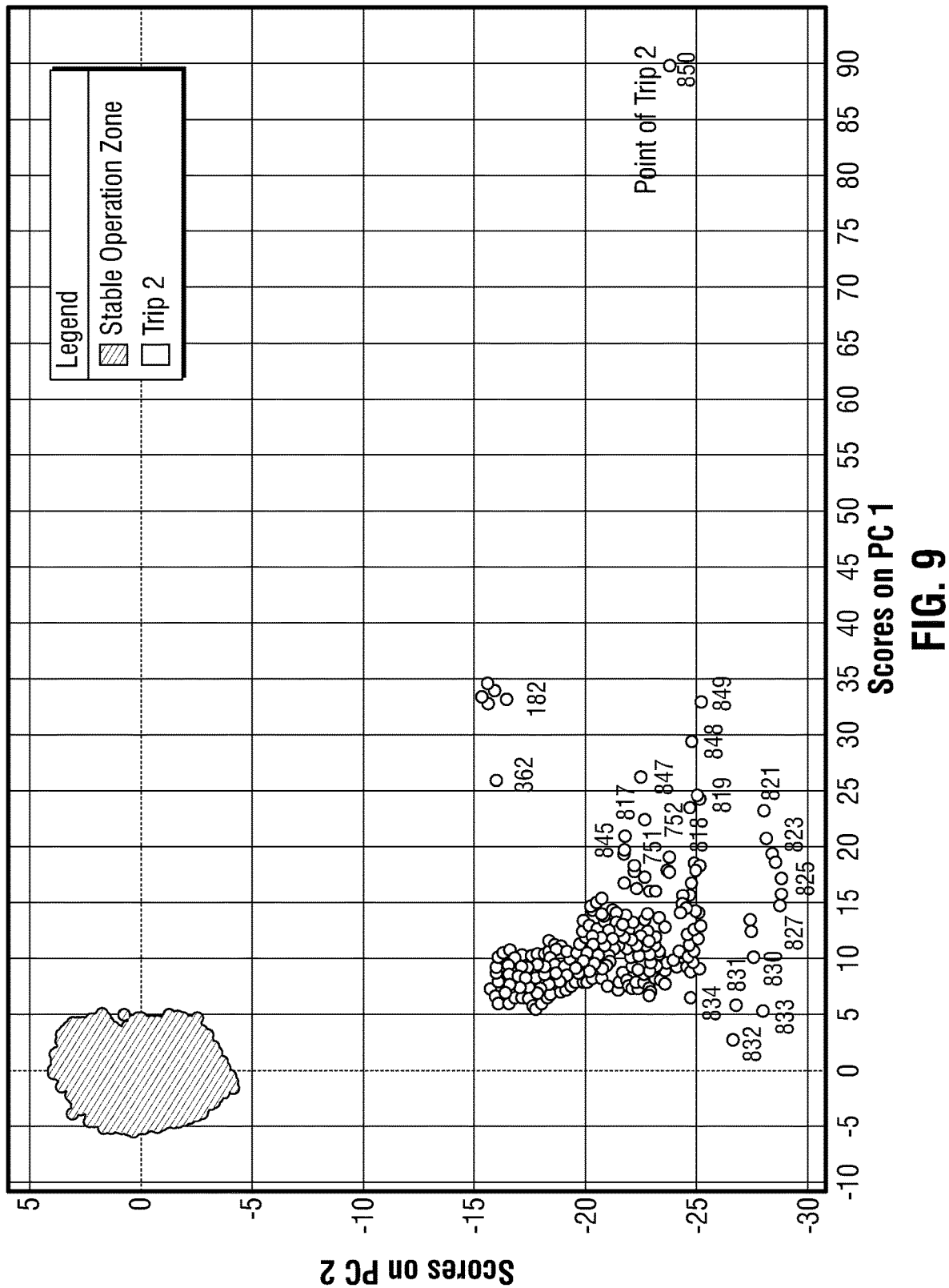
FIG. 9 illustrates comparison of scores of stable operation zones and Trip 2, in accordance with embodiments of the present disclosure.
Figure 10:
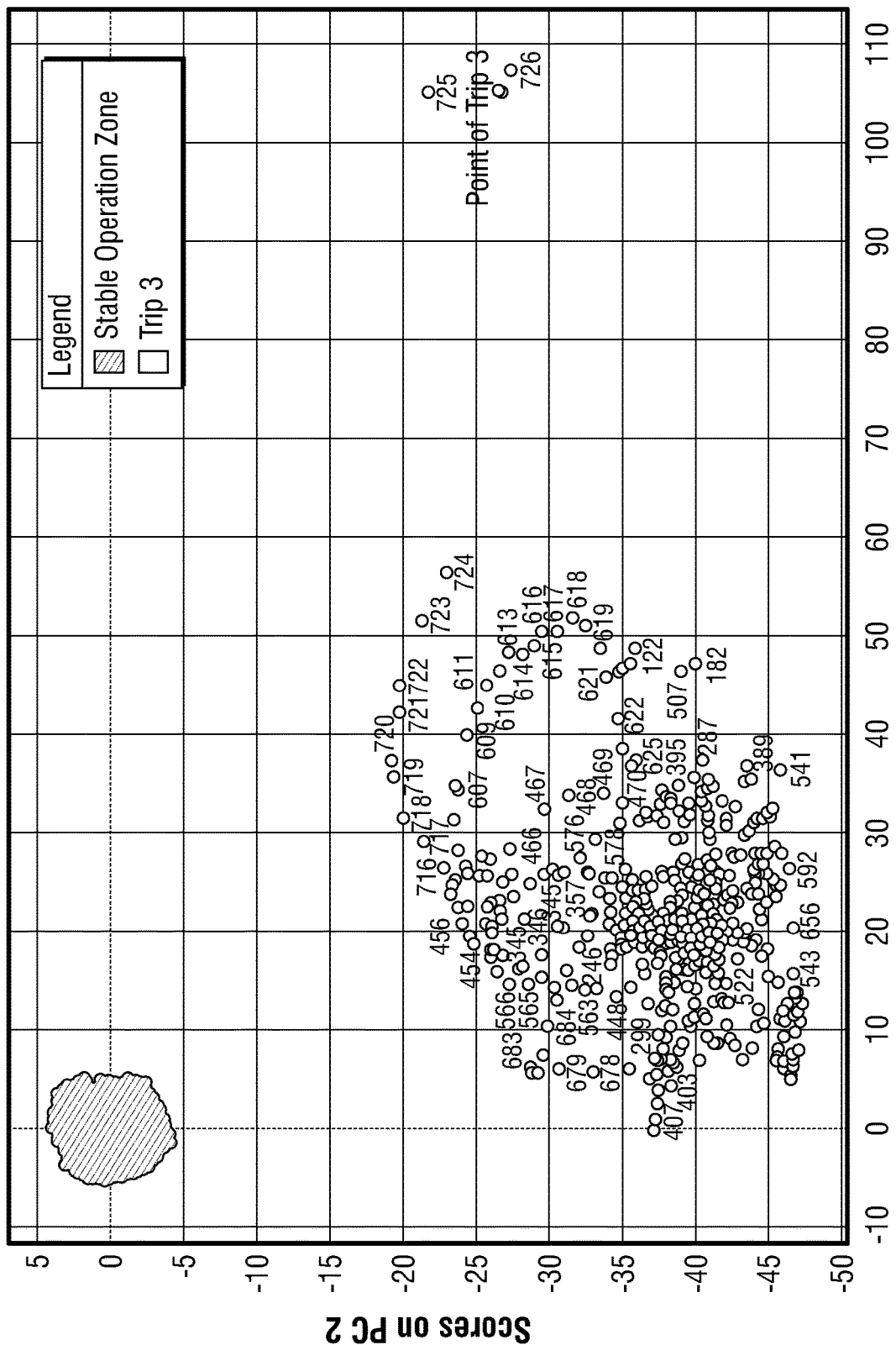
FIG. 10 illustrates comparison of scores of stable operation zones and Trip 3, in accordance with embodiments of the present disclosure.
Figure 11:
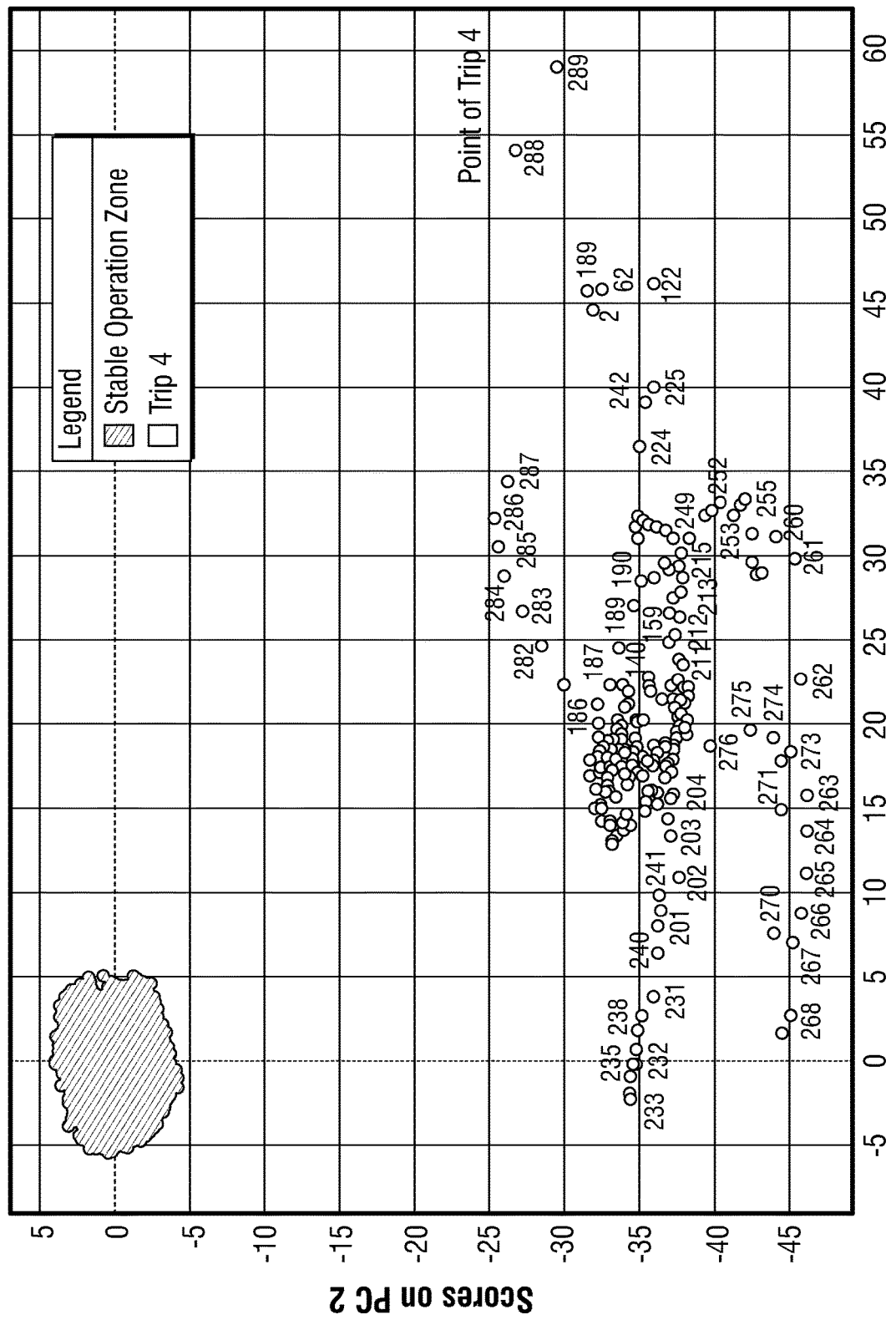
FIG. 11 illustrates comparison of scores of stable operation zones and Trip 4, in accordance with embodiments of the present disclosure.
Figure 12:
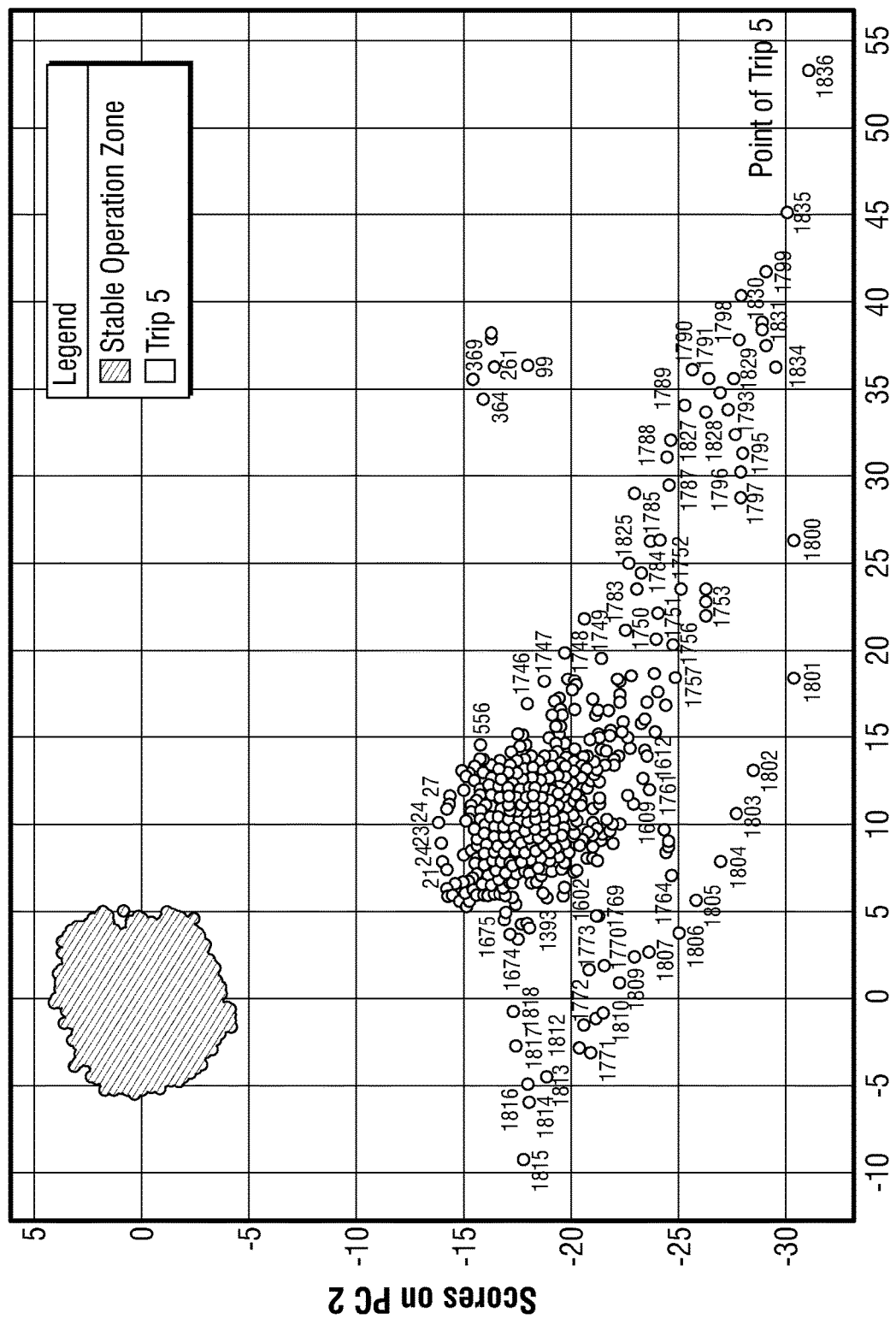
FIG. 12 illustrates comparison of scores of stable operation zones and Trip 5, in accordance with embodiments of the present disclosure.

The transition from the normal behavior was observed for 850 minutes in the scenario depicted in FIG. 9 and no steps were adopted to resolve the issue. However, today there is no mechanism to record and visualize this abnormal behavior. Having a dashboard representation of ESP operation using PCA model can help the engineers visualize and analyze the health of ESP under observation.

These patterns help distinguish between stable operation conditions and impending abnormal events in ESPs. This pattern recognition approach can help proactively monitor and predict trips and failures in advance. The trip happens at 1518 time step in FIG. 9. As the frequency of time steps is in minutes, therefore the trip happened at 1518th minute from start of the abnormal transition region. As this is a real scenario from an oilfield, it can be inferred that the ESP was behaving abnormally for more than 24 hours before it actually tripped. Had this mechanism of identifying patterns using PCA Modeling been in place, there would have been ample time for preventive action that could mitigate or altogether avoid each problem.

This methodology can be extended to a real-time monitoring platform to observe health of any ESP. The Robust PCA model can be initially trained using stable time period data for the different variables. The first two principal components can be used to get the stable zone in the plot of scores of principal component 1 and principal component 2. Once, the model is trained and the P and E matrix is obtained, the data for the various variables obtained from the sensors every minute can be assimilated and fed as prediction data into the model to obtain the new scores of the first two principal components at that time step. This can be continuously fed for every time step and the results can be obtained. As long as ESP is operating smoothly, the point will lie within the zone. Otherwise, if with increasing time steps, it is observed that the points move farther away from the stable zone cluster, it indicates that the ESP is functioning abnormally and approaching towards a trip or a failure.

In the general form, the PCA Model, $X=TP^T+E$, $TP^T$ represents the systematic part of the process variation described by the model and the residual matrix E contains the non-systematic part not described by the model. T is columnwise orthogonal and P is columnwise orthonormal, i.e., $T^TT=D$ and $P^TP=1$, where D is a diagonal matrix and I is the identity matrix.

Figure 13:
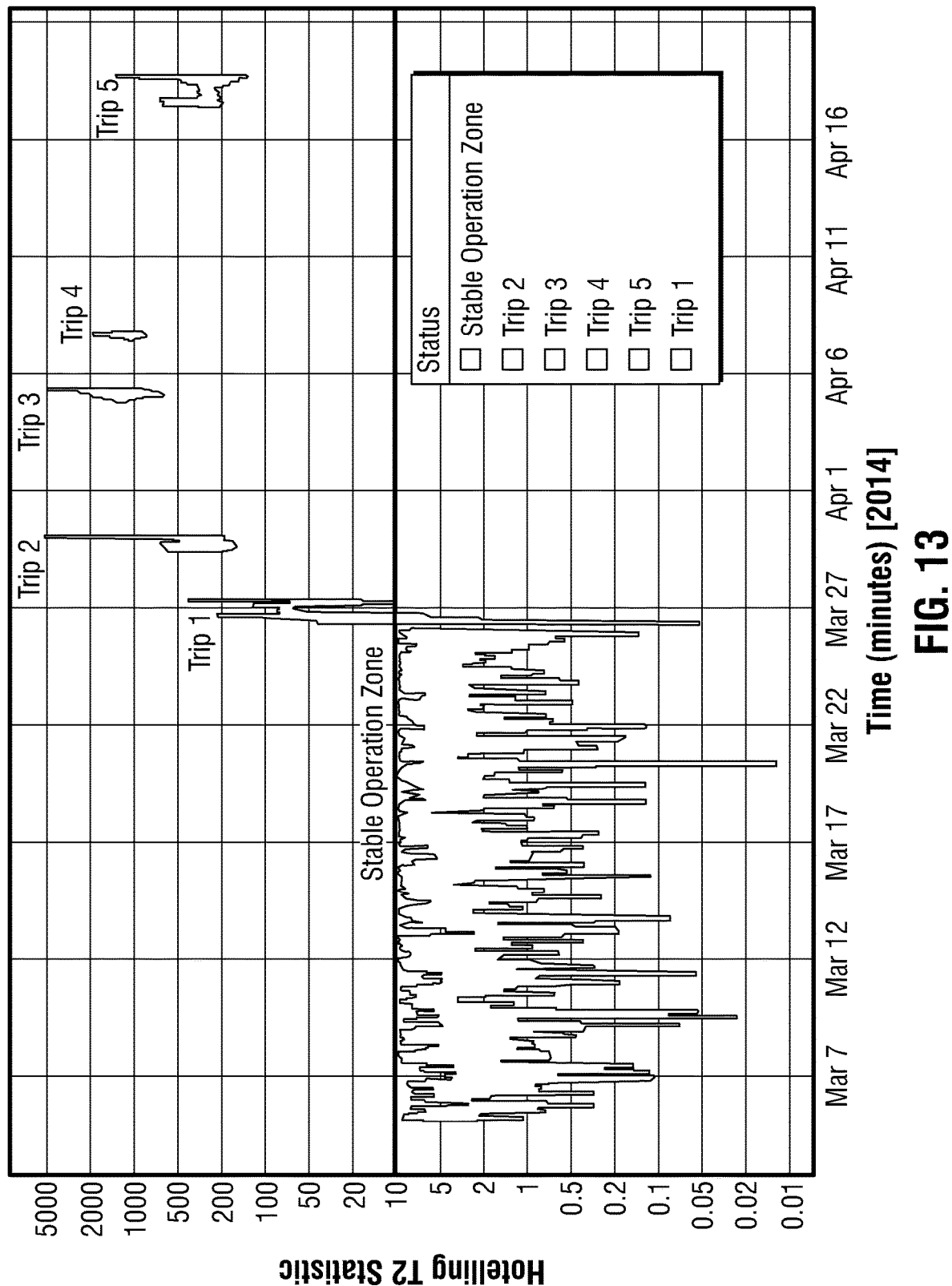
FIG. 13 illustrates a hotelling T-square plot for stable operating zone and various trips, in accordance with embodiments of the present disclosure.

The Hotelling T-square statistic represents a measure of the variation in each sample in the model. It indicates how far each sample is from the center (scores=0) of the model.

$$\text{Hotelling } T2_i = t_i \lambda^{-1} t_i^T, \quad (2)$$

where $t_i$ refers to the $i^{th}$ row of $T_R$, the t×R matrix of scores for each new batch or time step in the model; $\lambda$ is the covariance matrix of stable operation zone T and is a diagonal matrix containing the eigenvalues $\lambda_1$ through $\lambda_R$ corresponding to R principal components in the model represented as:

$$\lambda^{-1} = \frac{T^TT}{(N-1)^{-1}}, \quad (3)$$

where N represents the count of time steps or batches obtained for the stable operation zone Hotelling T-square distribution statistic is calculated at every time step in the stable operation zone and the various transition zones leading the trips. This statistic is plotted against time on a semi-log plot as shown in FIG. 13. It is observed that this statistic monitored over time stays within the chi-square limit for stable operation and exceeds the limit during unstable (transient) ESP operation, long before an ESP trips or fails. The actual value of this statistic during the transition period leading to a trip or failure shows an increase of more than two orders of magnitude compared to its normal value. The statistic successfully identified all impending trips or failures a few hours before they actually occurred, as shown in FIG. 13.

By proactively monitoring the Scores Plot and the Hotelling T-square Plot in real-time, an impending event can be predicted much in advance. However, predicting an impending event is not a complete solution. In addition, models to diagnose the cause and prevent an ESP from failing are also established.

The second step in the ESP analytical workflow is to diagnose the cause of to a trip or failure using diagnostic analytics. The predictive model is enhanced to determine the contribution of each of the 22 variables towards an abnormal impending event. Contribution plots are useful in revealing the variables that make the highest contribution towards the event. By determining the contributions of each of the variables and assigning priority based on the contributions, potential cause may be diagnosed.

The variable values at the new time step in the prediction data corresponding to an abnormal event dataset is projected onto the PCA model. This yields the following relationship:

$$x_{new} = t_{new} P^T + e_{new}. \quad (4)$$

Therefore, $$t_{new} = x_{new} P(P^T P)^{-1}, \quad (5)$$

where $x_{new}$ represents a 1Xp matrix at a time step or batch in the prediction set and $(P^T P)^{-1}$ mostly equals the identity matrix.

The $D_{new}$ statistic or T-square statistic was calculated for each new prediction set and further extended to calculate contributions of each variable for every batch at individual time steps. This is defined as:

$$D_{new} = t_{new} \lambda^{-1} t_{new}^T, \quad (6.1)$$

$$D_{new} = t_{new} \lambda^{-1} [x_{new} P(P^T P)^{-1}]^T, \quad (6.2)$$

$$D_{new} = t_{new} \lambda^{-1} \sum_{p=1}^{22} [x_{new,p} P_p (P^T P)^{-1}]^T, \text{ and} \quad (6.3)$$

$$D_{new} = \sum_{p=1}^{22} t_{new} \lambda^{-1} [x_{new,p} P_p (P^T P)^{-1}]^T. \quad (6.4)$$

Therefore, the contribution of each variable $x_{new,j}$ of a new batch $x_{new}$ to the D statistic equals $c_p = t_{new} \lambda^{-1} [x_{new,j} P_p (P^T P)^{-1}]^T$ where $t_{new}$ is a matrix of 1X R, $\lambda^{-1}$ is a matrix of RXR, $x_{new,j}$ is a matrix of 1×1, $P_p$ is a matrix of 1XR and P is a matrix of P×R.

Average contribution of each variable for the prediction set having t time steps is $$Cp = \sum_{t=1}^{t} \frac{c_{pn}}{t}. \quad (7)$$

Figure 14:
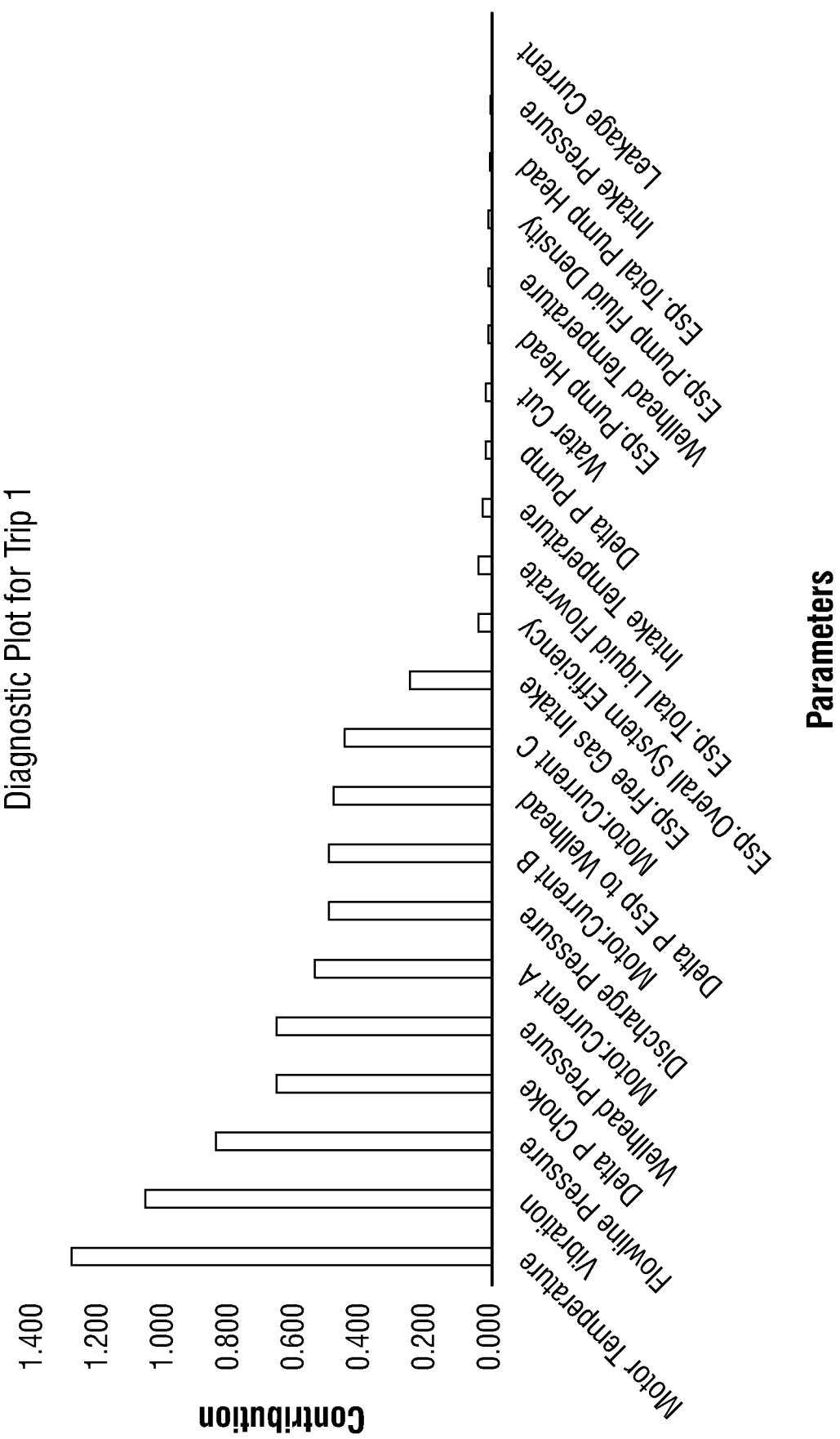
FIG. 14 illustrates a diagnostic plot for Trip 1, in accordance with embodiments of the present disclosure.
Figure 15:
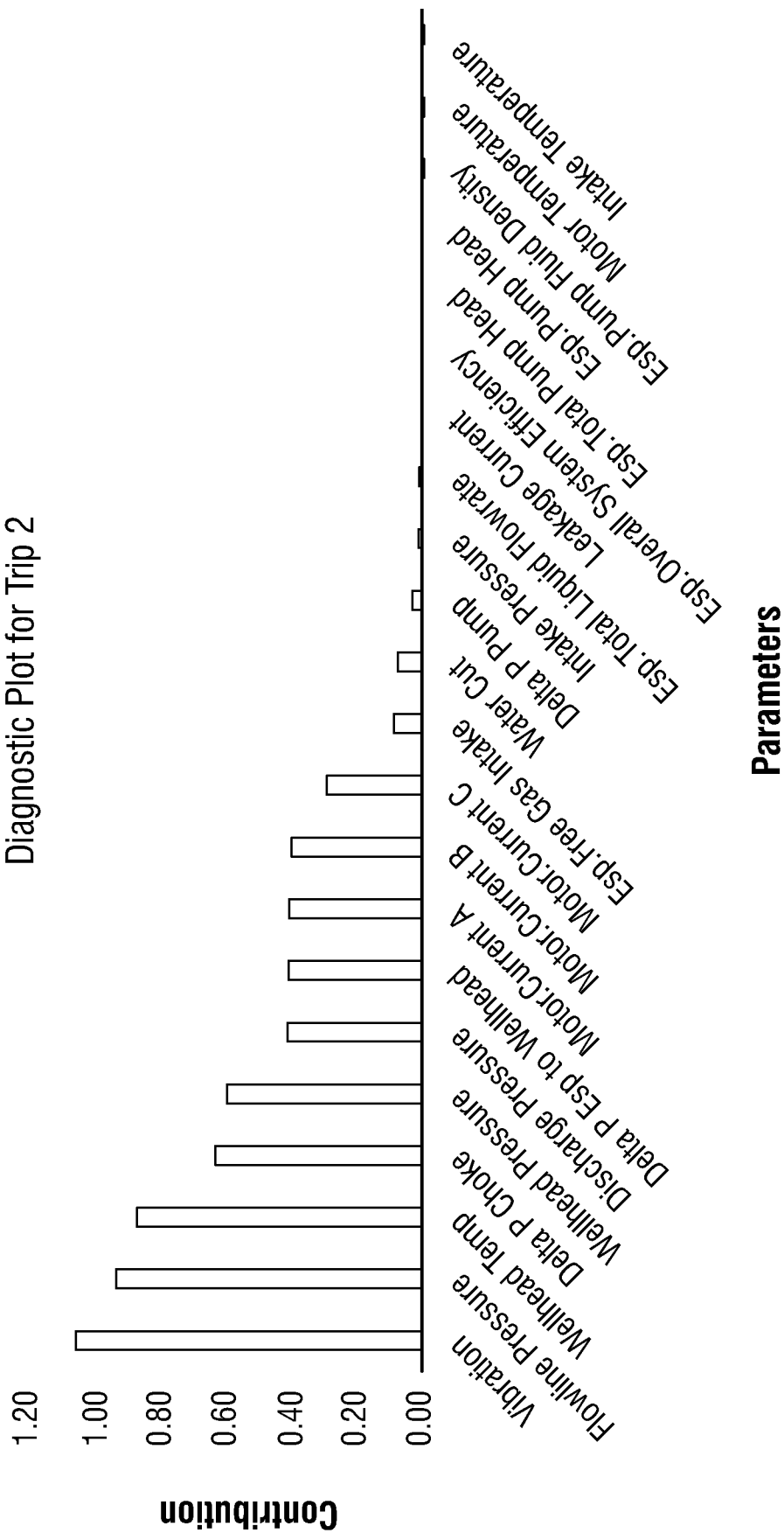
FIG. 15 illustrates a diagnostic plot for Trip 2, in accordance with embodiments of the present disclosure.

The contributions can help in deciding the ranking of variables. The higher the value of the contribution, the higher is the rank. The ranking chart can be used to determine the variable causing the impending failure or trip. Diagnostic plots for two Trip scenarios are shown in FIG. 14 and FIG. 15. The variables in these plots are arranged in decreasing order of their contribution from left to right. Motor Temperature mainly lead to the abnormal behavior in Trip 1. The ranking of the variables using this methodology are in agreement with what was observe during this trip as explained above with reference to FIG. 7. Motor temperature can increase due to production of gas in the pump, presence of abrasive solids or underutilization of the pump.

In this scenario, as the choke is increased, the scores started to adjust and move towards the stable zone. However, if by increasing the choke, the scores would have not moved towards stable zone as is observed in FIG. 7, it would indicate that the correct action is not being taken to solve the problem. It could also mean that there is skin and increasing the choke is not the solution. It would perhaps require a stimulation job to resolve the problem. In this manner, combination of ESP health monitoring using pattern recognition and contribution charts may help troubleshoot and fix the problems.

System Vibration mainly influenced the abnormal behavior in Trip 2. Vibrations indicate onset of potential severe mechanical or electrical problems, as may have been the case in Trip 2.

These contribution charts can be extended to a real-time monitoring platform and can contribute towards diagnosing the cause behind an abnormal behavior in real-time.

The third step in the workflow is application of prescriptive analytics to suggest remedial action to correct the abnormal behavior and avoid trips or failures.

Determination of Stable Operation Range:

$D_{new}$ statistic definition can be further extended as:

$$D_{new} = t_{new} \lambda^{-1} t_{new}^T \sim \frac{R(I^2 - 1)}{I(I - R)} F(R, I - R, \alpha). \quad (8)$$

The D-statistic divided by some constant, follows an F-distribution with R and I-R degrees of freedom. $\alpha$ represents the boundary and is equivalent to the value at which the cdf of the probability distribution is equal to 0.95.

The above equation was used to calculate the stable operating range for each variable by setting an inequality as:

$$t_{new} \lambda^{-1} t_{new}^T \leq \frac{R(I^2 - 1)}{I(I - R)} F(R, I - R, \alpha). \quad (9.1)$$

On substituting the value of from equation (5), $$x_{new} P \lambda^{-1} P^T x_{new}^T \leq \frac{R(I^2 - 1)}{I(I - R)} F(R, I - R, \alpha), \quad (9.2)$$

where $x_{new}$ is a 1XP matrix. In order to determine the minimum and maximum stable operating values and set an operating range for each variable, the above quadratic inequality is solved individually for each variable $x_{new,p}$ and the stable operating values used in the training dataset are set for the other P-1 variables within $x_{new}$ matrix.

Figure 16:
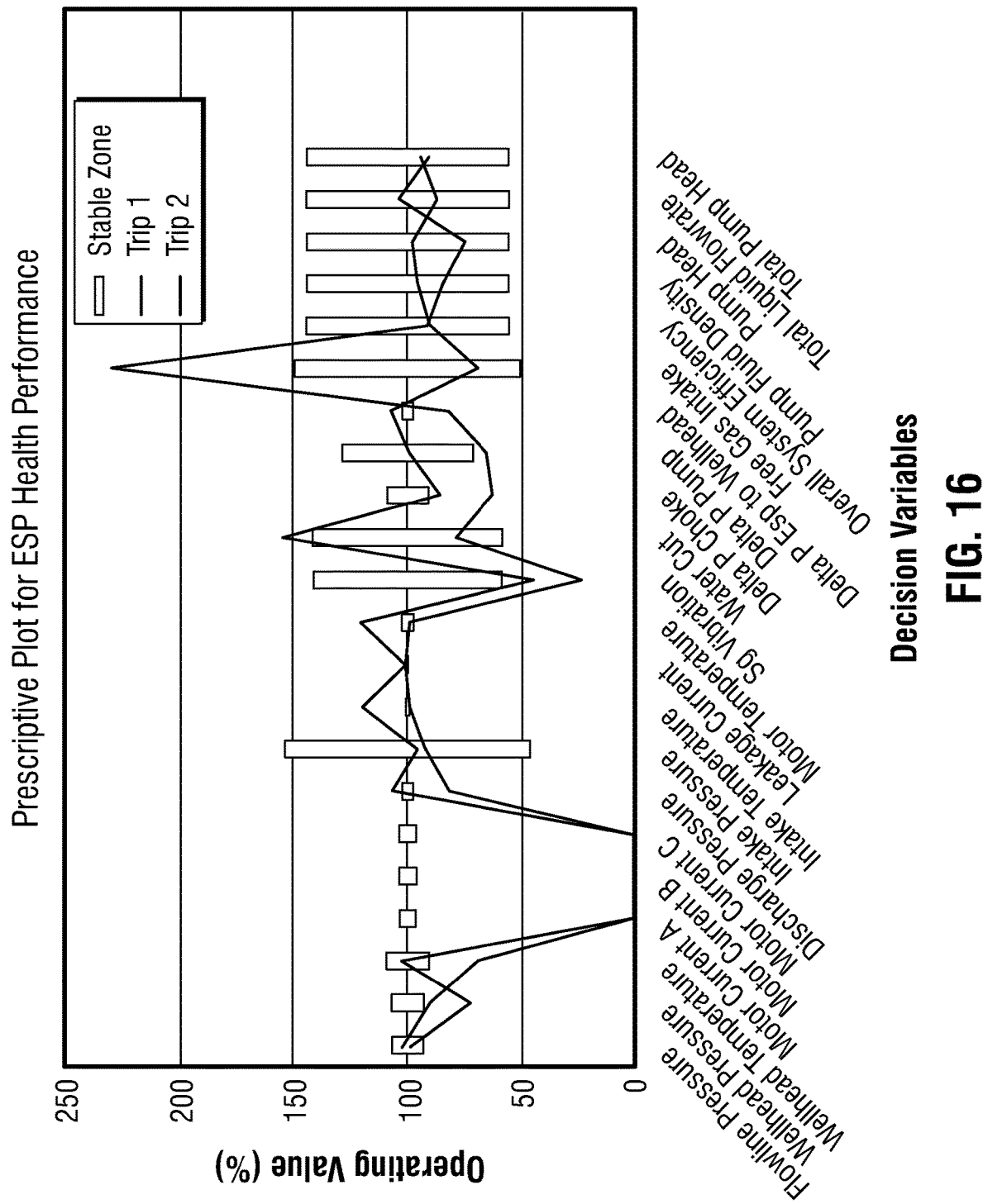
FIG. 16 illustrates a prescriptive plot for ESP health performance, in accordance with embodiments of the present disclosure.

The bars in FIG. 16 represent the stable operating range for each of the 22 variables. Since there is significant difference between magnitudes of various variables, the operating value is expressed in percentage. The line graphs represent the reading of the various variables at the time of two separate trip events, Trip 1 and Trip 2.

This plot is useful to distinguish between variables operating within the stable range and those operating outside their stable ranges and show how far are some of the variables operating outside their stable ranges in real time for every time step. Controllable variables such as choke and motor current can be reset such that all the variables get adjusted to lie within the stable bands. This plot is significant in enabling effective decision making and can also be extended to monitor the behavior of variables in real-time operations.

Remedial action to correct impending problem:

By resetting those variables which are operating outside the stable bands to a value inside the stable ranges, it is possible to correct the abnormal behavior and ensure that the ESP operates smoothly again.

The F-distribution has a relationship with chi-square distribution. Therefore, the above relationship can be represented as:

$$\frac{R(I^2-1)}{I(I-R)} F(R, I-R, \alpha) \sim \chi^2. \quad (10)$$

Once the variables are reset to ensure that all variables are operating inside stable bands, this batch is fed as prediction dataset into the model again. The new Hotelling T-square value obtained for this batch was observed to be within the stable operating zone. On substituting Equation (9.1) in Equation (10), we get:

$$T^2_{i,recalculated} = t_{i,recalculated} \lambda^{-1} t^T_{i,recalculated} \leq \chi^2. \quad (11)$$

Figure 17:
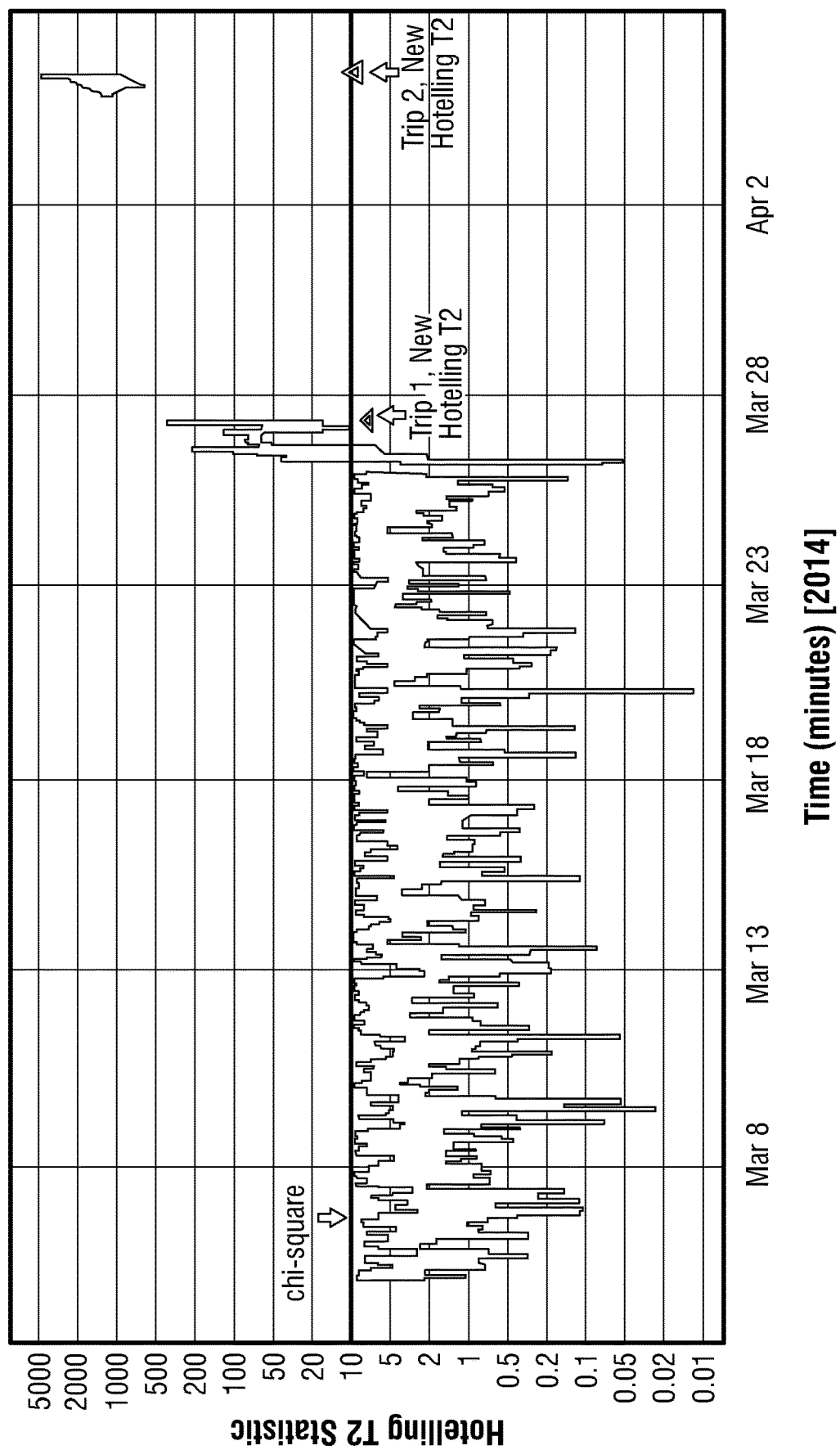
FIG. 17 illustrates new hotelling T-square values for the trips after resetting the variables, in accordance with embodiments of the present disclosure.

Hence, the recalculated value of Hotelling T-square statistic which was earlier more than two orders of magnitude is now less than $\chi^2$. It was observed that this statistic now stayed within the 95% confidence limit for the prediction data batch and did not exceed the stable limit anymore as seen earlier in FIG. 17. Therefore, this methodology successfully provides a remedial action to avoid and control impending trips or failures proactively.

A methodology for data-driven detection and diagnosis of impending ESP problems in real time has been proposed using Principal Component Analysis (PCA) dimensionality reduction technique. It creates an opportunity to advance from a reactive approach towards a more proactive approach based on predictive analysis, detection of an impending problem, diagnosis of the cause of the impending problem, and prescription of preventive action that will avoid or at least mitigate the impending problem.

In building the predictive model, historical data was used to determine and evaluate key operational variables (decision variables) that affect ESP performance. Based on historical data, a hybrid approach (combination of first principles and empirical statistics) was used to develop Principal Component Analysis model to capture trends and patterns in the behavior of ESPs. Trends or patterns during normal operation were identified and correlated to either satisfactory operation or impending problems. Six principal components obtained from the model output were sufficient to capture more than 96% of observed variance with 95% confidence limit. It can identify patterns in data based on scores and Hotelling T-square statistic and correlate them with normal operation or impending event. The model was further enhanced to identify key variables contributing to impending failure. It eventually prescribes stable operating ranges for each variable, thereby prescribing remedial action to mitigate and/or prevent failure. With this tool, there would be ample time to take preventive action that could mitigate or altogether avoid each problem.

This real-time analytical framework enables a shift towards proactive ESP monitoring to identify impending problems long before they occur thereby safeguarding ESP operation, reducing intervention costs and optimizing production. This approach creates opportunities to increase pump uptime, extend the life expectancy of ESPs and improve oilfield economics.

There are opportunities to extend the mathematical model to attribute different categories of failure or abnormal behavior like high gas, corrosion, electrical problems to different forms of patterns or clusters. This methodology can also be tested against other mechanical systems or other forms of artificial lift technology.

Given the emerging trend in the E&P industry of using downhole sensors for real-time surveillance of variables impacting ESP performance there is an opportunity for predicting and preventing ESP shutdowns using data analytics. The key benefits of the exemplary embodiments of the present disclosure are as follows: developing a data-driven analytical framework to advance towards a proactive approach for ESP health monitoring to proactively detect impending problems, diagnose their cause, and prescribe preventive actions, handling of real-time data; developing an ESP failure prevention mechanism, developing an algorithm to detect, diagnose and prescribe trip and failure events, using big data methodology, providing an end-to-end solution to proactively safeguard ESP operations using predictive, diagnostic and prescriptive analytics, reducing the oil loss volume relating with ESP tripping and failure, and extending the life span of the ESP in the producer wells.

Further key benefits include cost savings by reducing the number of well intervention such as: workover, equipment replacement and maintenance, etc., providing an interactive system to compute real-time collective effect of key ESP variables, identifying key obstacles in shortest time that lead to unstable ESP performance, defining preventive mechanism to safeguard ESP operation, reducing man-power needed for continuous monitoring of the ESP performance and optimization, and enabling better decision making to make sure ESP is operating in optimal conditions.

Figure 18:
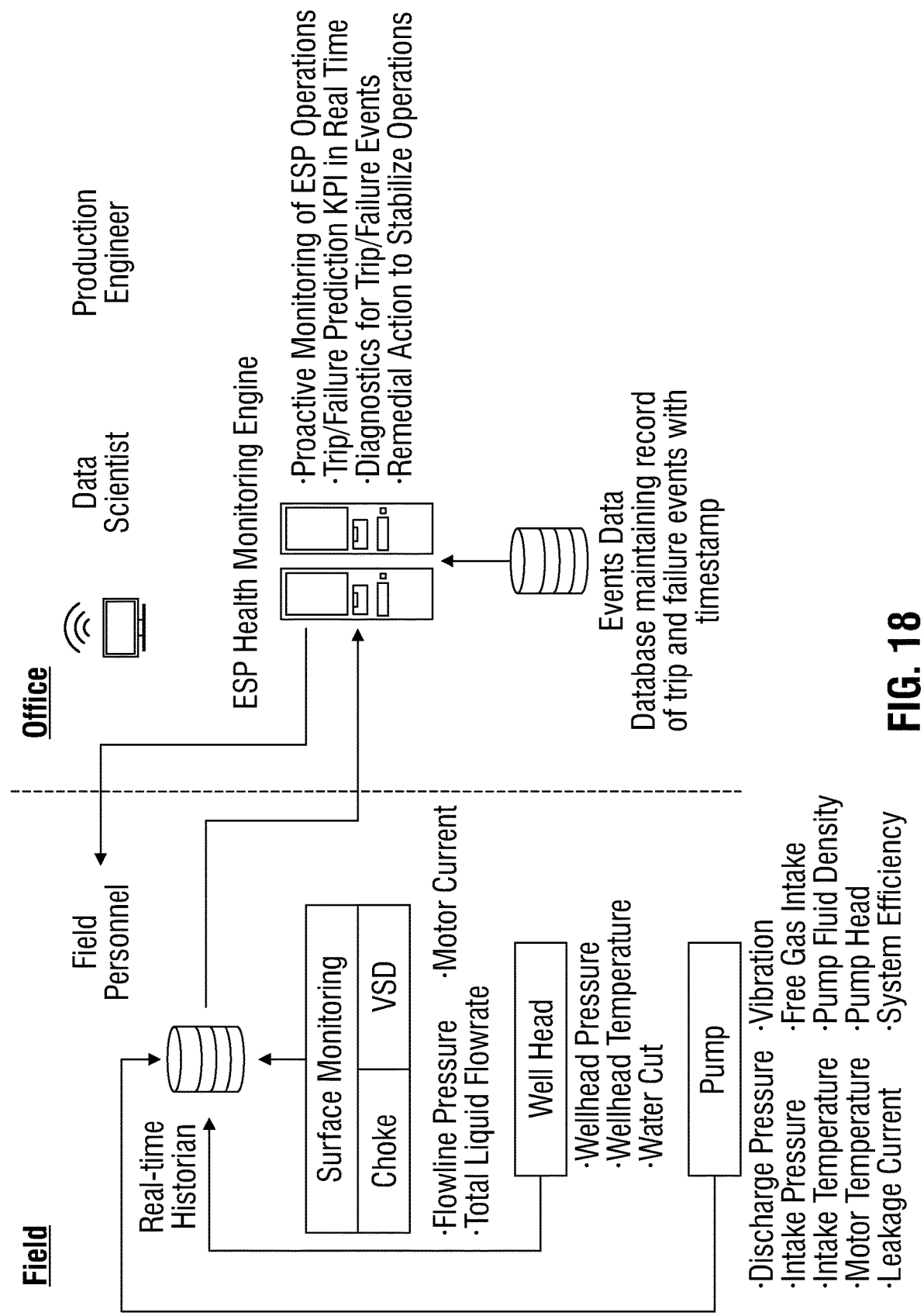
FIG. 18 illustrates an exemplary high level big data analytics system architecture for ESP health maintenance, in accordance with embodiments of the present disclosure.

Referring now to FIG. 18, an exemplary high level big data analytics system architecture for ESP health maintenance, in accordance with embodiments of the present disclosure, is shown and will be described. Given the increase in computational and communication power, as well as routine availability of large amounts of field data, there is an opportunity to build an ESP health monitoring software engine which processes real-time big data significant to ESP operation being collected from real-time historian gathering data from sensors installed on the pump, wellhead, and surface monitoring system and computes key performance indicators (KPI's) using analytics based algorithms. These computations can be performed at regular intervals based on the frequency at which data is being recorded.

This system can give the operator a medium to early detect deviation of ESP behavior from normal, integrate capability, and allow ample time for inspection and action that could mitigate or altogether avoid anomalies. If the predictive KPI shows a trend towards an impending failure, the system would generate an alarm and alert field personnel, production engineers, and data scientist via email or a mobile device, at any time of day. The engineering team can then quickly diagnose the issue and take appropriate corrective actions. These actions can be validated by processing data for the next time step against the boundaries of the stable envelope defined by the Predictive KPI. Quickly returning the system to normal operations minimizes downtime and associated production deferment.

The intelligence of the system lies in both building predictive models from available historical data with little human intervention, and automatically using such models for automated real-time detection, diagnosis, and correction.

Transmitted herewith are the following documents, the entire contents of each of which are incorporated herein by reference:
(1) Thesis: Applying Predictive Analytics to Detect and Diagnose Impending Problems in Electric Submersible Pumps; presented to the Faculty of the Department of Chemical and Bimolecular Engineering (University of Houston) by Supriya Gupta, August 2015.
(2) Master's Thesis Defense (PowerPoint presentation); Applying Predictive Analytics to Detect and Diagnose Impending Problems in Electric Submersible Pumps (ESP) by Supriya Gupta, Aug. 3, 2015; Petroleum Engineering Program.
(3) Gupta, S., Saputelli, L., & Nikolaou, M. (2016, Oct. 17). Big Data Analytics Workflow to Safeguard ESP Operations in Real-Time. Society of Petroleum Engineers. doi: 10.2118/181224-MS.
(4) Gupta, S., Saputelli, L., & Nikolaou, M. (2016, Sep. 26). Applying Big Data Analytics to Detect, Diagnose, and Prevent Impending Failures in Electric Submersible Pumps. Society of Petroleum Engineers. doi:10.2118/181510-MS.
(5) Gupta, S., Nikolaou, M., Saputelli, L., & Bravo, C. (2016, Sep. 6). ESP Health Monitoring KPI: A Real-Time Predictive Analytics Application. Society of Petroleum Engineers. doi:10.2118/181009-MS.

Persons skilled in the art will understand that the devices and methods specifically described herein and illustrated in the accompanying drawings are non-limiting exemplary embodiments. The features illustrated or described in connection with one exemplary embodiment may be combined with the features of other embodiments. Such modifications and variations are intended to be included within the scope of the present disclosure.

The foregoing examples illustrate various aspects of the present disclosure and practice of the methods of the present disclosure. The examples are not intended to provide an exhaustive description of the many different embodiments of the present disclosure. Thus, although the foregoing present disclosure has been described in some detail by way of illustration and example for purposes of clarity and understanding, those of ordinary skill in the art will realize readily that many changes and modifications may be made thereto without departing form the spirit or scope of the present disclosure.

While several embodiments of the disclosure have been shown in the drawings and described in detail hereinabove, it is not intended that the disclosure be limited thereto, as it is intended that the disclosure be as broad in scope as the art will allow. Therefore, the above description and appended drawings should not be construed as limiting, but merely as exemplifications of particular embodiments. Those skilled in the art will envision other modifications within the scope and spirit of the claims appended hereto.

What is claimed is:

1. A method for monitoring performance of an electrical submersible pump (ESP) in a well, the method comprising:
    selecting a plurality of decision variables;
    obtaining, via at least one sensor, real-time data related to the plurality of decision variables;
    detecting patterns from the plurality of decision variables indicating impending events by modeling the plurality of decision variables via a Robust Principal Component Analysis (Robust PCA) to establish patterns in collected data and to identify such patterns in the real-time data;
    ranking the plurality of decision variables based on contribution of each variable to the impending events;
    determining which of the plurality of decision variables are outside a stable operating range for each of the plurality of decision variables; and
    suggesting remedial action to prevent impending events.

2. The method of claim 1, wherein the impending events are a trip or a failure.

3. The method of claim 2, wherein the real-time data includes information of the plurality of decision variables across surface, wellbore, and downhole gauges, and on whether a trip or failure occurred.

4. The method of claim 1, further comprising:
    establishing patterns from the plurality of decision variables indicating absence of impending events (normal operation); and
    determining the stable operating range for each of the plurality of decision variables.

5. The method of claim 4, wherein the collected data includes (i) time-series of information of the plurality of decision variables across surface, well bore, and downhole gauges and (ii) times at which the trip or the failure occurred.

6. The method of claim 1, wherein the plurality of decision variables include at least one or more of the following: flowline pressure, wellhead pressure, wellhead temperature, motor current, pump intake pressure, pump discharge pressure, intake temperature, leakage current, motor temperature, system vibration, water cut, free gas intake, total liquid flow rate, system efficiency, pump liquid density, pump head, total pump head, ~p across pump, M across choke, or ~p ESP across wellhead.

7. The method of claim 1, further comprising removing outlier data from the collected data or from the real-time data.

8. The method of claim 7, further comprising identifying a training dataset from a stable time period free from impending events where the plurality of decision variables operate at a stable value, and using this dataset to build the Robust PCA.

9. The method of claim 8, further comprising testing the Robust PCA built, by comparing predictions of the Robust PCA of impending events to actual events in the testing dataset, in which deviations from stable behavior of each of the plurality of decision variables actually occurred.

10. The method of claim 1, further comprising determining a contribution of each of the plurality of decision variables and assigning a priority to each of the plurality of decision variables based on their respective contribution.

11. The method of claim 10, further comprising ranking the plurality of decision variables based on computed average contribution.

12. The method of claim 11, further comprising creating a ranking chart to determine which of the plurality of decision variables is causing one or more of the impending events.

13. The method of claim 1, further comprising predicting the impending events before occurrence and preventing the impending events by using a data-driven analytical framework.

14. A method for predicting and preventing electrical submersible pump (ESP) trip and failure events, the method comprising:
    collecting real-time data from a well and an ESP positioned in a well via a plurality of sensors;
    manipulating historical data to determine and evaluate a plurality of decision variables;
    using mathematical models to derive trends and patterns based on a relationship between the plurality of decision variables and behavior of the ESP;
    associating the trends and patterns with trip and failure events;
    diagnosing causes of the trip and failure events;

suggesting remedial action to prevent the trip and failure events; and determining a stable operating range of each of the plurality of decision variables;

wherein the historical or real-time data includes (i) time-series of information of the plurality of decision variables across surface, wellbore, and downhole gauges and (ii) on whether a trip or the failure occurred.

15. The method of claim 14, further comprising ranking the plurality of decision variables based on contribution to the impending events.

16. The method of claim 14, wherein the plurality of decision variables include at least one or more of the following: flowline pressure, wellhead pressure, wellhead temperature, motor current, pump intake pressure, pump discharge pressure, intake temperature, leakage current, motor temperature, system vibration, water cut, free gas intake, total liquid flow rate, system efficiency, pump liquid density, pump head, total pump head, ~p across pump, M across choke, or ~p ESP across wellhead.

17. A system for monitoring performance of an electrical submersible pump (ESP) in a well, the system comprising:
a sensor configured to sense real-time data; and
a controller having at least one processor used to control a software algorithm to:
select a plurality of decision variables;
obtain real-time data, via the sensor, related to the plurality of decision variables;
detect patterns from the plurality of decision variables indicating impending events;
rank the plurality of decision variables based on a contribution of each variable to the impending events;
determine which of the plurality of decision variables are operating outside a stable operating range;
suggest remedial action to prevent impending events; and
identify a training dataset to build a Robust Principal Component Analysis (Robust PCA) model, the training dataset derived from a stable time period free from impending events where the plurality of decision variables operate at a stable value.

18. The system of claim 17, wherein the software algorithm further tests the Robust PCA model built, by comparing the model's predictions of impending events to actual events in the testing dataset, in which deviations from stable behavior of each of the plurality of decision variables actually occurred.

19. A system for predicting and preventing electrical submersible pump (ESP) trip and failure events, the system comprising at least one processor used to control a software algorithm to:
collect data, in real-time, from a well and an ESP positioned in a well via a plurality of sensors;
manipulate historical data to determine and evaluate a plurality of decision variables;
use mathematical models to derive trends and patterns based on a relationship between the plurality of decision variables and behavior of the ESP;
associate the trends and patterns with trip and failure events;
diagnose causes of the trip and failure events;
prescribe remedial action to prevent the trip and failure events; and
receive a training dataset to build a Robust Principal Component Analysis (Robust PCA) model, the training dataset derived from a stable time period free from impending events where the plurality of decision variables operate at a stable value.

20. The system of claim 19, wherein the processor further controls the software algorithm to model, via a Robust Principal Component Analysis (PCA) methodology, the plurality of decision variables to establish patterns in collected data and to identify such patterns in the real-time data.

21. The system of claim 20, wherein the processor further controls the software algorithm to determine a stable operating range for each of the plurality of decision variables.

22. The system of claim 21, wherein the processor further controls the software algorithm to test the model by inputting a prediction dataset by identifying windows of time periods when deviations from stable behavior of each of the plurality of decision variables are detected.

23. A method for predicting and preventing electrical submersible pump (ESP) trip and failure events, the method comprising:
collecting real-time data from a well and an ESP positioned in a well via a sensor;
manipulating historical data to determine and evaluate a plurality of decision variables;
using mathematical models to derive trends and patterns based on a relationship between the plurality of decision variables and behavior of the ESP;
associating the trends and patterns with trip and failure events;
using a Robust Principal Component Analysis (Robust PCA) methodology to model the plurality of decision variables to identify the trends and patterns in the real-time data;
diagnosing causes of the trip and failure events; and
prescribing remedial action to prevent the trip and failure events.

24. The method of claim 23, further comprising:
inputting a training dataset in the Robust PCA model, the training dataset derived from a stable time period free from trip or failure events where the plurality of decision variables operate at a stable value;
inputting a prediction dataset by identifying windows of time periods when deviations from stable behavior of each of the plurality of decision variables is detected; and
obtaining trip zone scores and comparing the trip zone scores with stable zone statistics.

* * * * *